United States Patent
Kashio

(10) Patent No.: US 7,825,340 B2
(45) Date of Patent: Nov. 2, 2010

(54) DOUBLE-SIDED WIRING BOARD, MANUFACTURING METHOD OF DOUBLE-SIDED WIRING BOARD, AND MOUNTING DOUBLE-SIDED WIRING BOARD

(75) Inventor: Hitoshi Kashio, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 31 days.

(21) Appl. No.: 12/193,492

(22) Filed: Aug. 18, 2008

(65) Prior Publication Data

US 2009/0133918 A1 May 28, 2009

(30) Foreign Application Priority Data

Nov. 26, 2007 (JP) ............... 2007-304774

(51) Int. Cl.
*H05K 1/11* (2006.01)
(52) U.S. Cl. ............... 174/262; 174/261; 174/266; 361/760
(58) Field of Classification Search ......... 174/260–266; 361/760

See application file for complete search history.

(56) References Cited

U.S. PATENT DOCUMENTS 5,926,951 A * 7/1999 Khandros et al. ............ 29/843
2004/0078964 A1 * 4/2004 Itou et al. ............... 29/840
2006/0254808 A1 * 11/2006 Farnworth et al. ......... 174/250
2007/0017699 A1 * 1/2007 Ishimoto et al. ............ 174/260

FOREIGN PATENT DOCUMENTS

| JP | 3-79480 U | 8/1991 |
| JP | 9-148698 A | 6/1997 |
| JP | 10-229272 A | 8/1998 |
| JP | 2002-57429 A | 2/2002 |
| JP | 2004-281437 A | 10/2004 |
| JP | 2004-327645 A | 11/2004 |
| JP | 2007-189125 A | 7/2007 |

* cited by examiner

*Primary Examiner*—Dameon E Levi
*Assistant Examiner*—Hoa C Nguyen
(74) *Attorney, Agent, or Firm*—Birch, Stewart, Kolasch & Birch, LLP

(57) ABSTRACT

In one embodiment of the present invention, a connecting device of a double-sided wiring board includes a first-side connecting land portion configured by a first-side conductive layer and a first-side connecting conductive layer and a second-side connecting land portion configured by a second-side conductive layer; the first-side connecting land portion and the second-side connecting land portion face each other at respective central portions with an insulating substrate sandwiched therebetween; a substrate hole is formed corresponding to a peripheral end portion of the first-side connecting land portion and a peripheral end portion of the second-side connecting land portion; and the peripheral end portion of the first-side connecting land portion and the peripheral end portion of the second-side connecting land portion are connected to each other via the substrate hole.

5 Claims, 19 Drawing Sheets

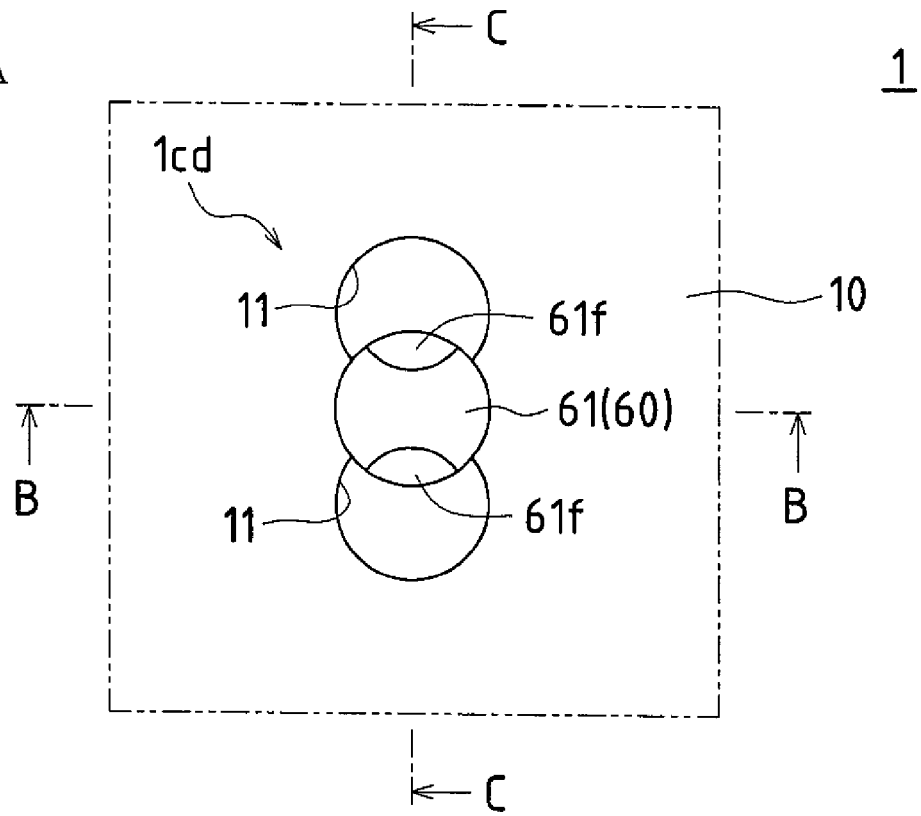
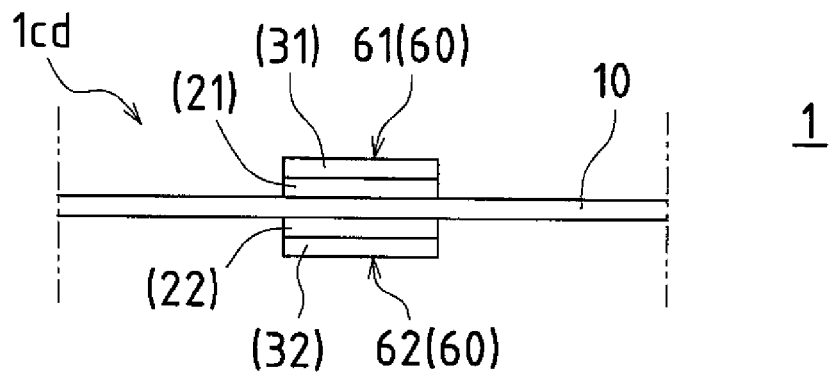
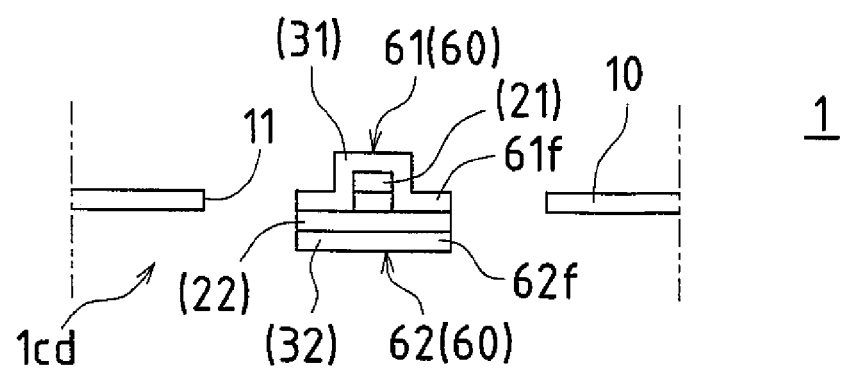

DOUBLE-SIDED WIRING BOARD, MANUFACTURING METHOD OF DOUBLE-SIDED WIRING BOARD, AND MOUNTING DOUBLE-SIDED WIRING BOARD

BACKGROUND OF THE INVENTION

This application claims priority under 35 U.S.C. §119(a) on Japanese Patent Application No. 2007-304774 filed in Japan on Nov. 26, 2007, the entire contents of which are hereby incorporated by reference.

The present invention relates to a double-sided wiring board provided with a connecting device serving as a connecting region to be connected to the outside, a manufacturing method of such a double-sided wiring board, and a mounting double-sided wiring board using such a double-sided wiring board.

In recent years, portable electronic equipment such as mobile phones has been widely provided. Although the portable electronic equipment has been made more compact in view of the portability, even greater functionality is sought. For this reason, there is an extreme demand for, for example, higher-precision, smaller, and thinner circuit wiring boards used in the portable electronic equipment.

In such circumstances, the circuit wiring boards are required to provide high-density wiring, high-functionality wiring (solid wiring or bending wiring), and high-density mounting. Thus, there also is an extreme demand for a higher-precision and higher-density interlayer connection.

FIGS. 20A and 20B are explanatory diagrams schematically showing the structure of a double-sided wiring board according to Conventional Example 1, where FIG. 20A is a plan view and FIG. 20B is an end face view of a cut section as viewed from arrows B-B in FIG. 20A. It should be noted that hatching is completely omitted from the end face view for clarity of illustration. This also applies to end face views described below.

In a double-sided wiring board 101 according to Conventional Example 1, a through-hole 112 is formed in an insulating substrate 110; a first-side conductive layer 121 and a second-side conductive layer 122 are connected to each other by a connecting conductive layer 130; a connecting device 101cd having a so-called through-hole, mini-land through-hole, landless through-hole, or the like is thus formed; and the connecting device 101cd is connected from the outside.

In the double-sided wiring board 101 according to Conventional Example 1, the connecting conductive layer 130 is made small in order to meet the demand for higher precision and higher density, and thus there is a problem with the strength.

FIGS. 21A and 21B are explanatory diagrams schematically showing the structure of a double-sided wiring board according to Conventional Example 2, where FIG. 21A is a plan view and FIG. 21B is an end face view of a cut section as viewed from arrows B-B in FIG. 21A.

In a double-sided wiring board 101 according to Conventional Example 2, a substrate hole 111 is formed in an insulating substrate 110; a first-side conductive layer 121 and a second-side conductive layer 122 in the form of connecting lands, which replace the through-hole 112 of Conventional Example 1, are connected by a connecting conductive layer 131; a connecting device 101cd having a so-called laser via (mini-land laser via, landless laser via) or the like is thus formed; and the connecting device 101cd is connected from the outside.

In the double-sided wiring board 101 according to Conventional Example 2, a first-side connecting land portion 161 and a second-side connecting land portion 162 are formed, so that the strength is improved compared to Conventional Example 1. However, portions where a connection is made to the insulating substrate 110 are very small, and thus it is difficult to obtain sufficient strength.

FIGS. 22A and 22B are explanatory diagrams schematically showing the structure of a mounting double-sided wiring board according to Conventional Example 3, where FIG. 22A is a plan view and FIG. 22B is an end face view of a cut section as viewed from arrows B-B in FIG. 22A.

In a mounting double-sided wiring board 102 according to Conventional Example 3, a solder ball 10b, which is to be connected to the outside, is formed on the double-sided wiring board 101 shown as Conventional Example 2. However, since the first-side connecting land portion 161 is in the form of a recess, an air bubble Air is in some cases trapped in the solder ball 102b joined thereto, and thus there is a problem with the reliability of connection.

The circuit wiring boards shown in Conventional Examples 1, 2, and 3 are used for various purposes. Particularly when the circuit wiring boards are used in the above-mentioned portable electronic equipment, there is a considerable demand for thinner and flexible double-sided wiring boards 101. That is to say, the insulating substrate 110, the first-side conductive layer 121, and the second-side conductive layer 122 are required to be made thinner and flexible. Therefore, the insulating substrate 110, the first-side conductive layer 121, and the second-side conductive layer 122 are each formed to be thin, which results in a decrease in the mechanical strength.

With the decrease in the mechanical strength of each of the insulating substrate 110, the first-side conductive layer 121, and the second-side conductive layer 122, the adhesion of the conductive layers (the first-side conductive layer 121 and the second-side conductive layer 122) to the insulating substrate (the insulating substrate 110) is decreased, and thus there is the problem that the peel strength of the conductive layers is decreased. Moreover, as the patterns (the connecting land portions) are made smaller and finer, the bonding area of the conductive layers with respect to the insulating substrate is reduced, which also results in a decrease in the peel strength of the conductive layers.

In the above-described circumstances, the peel strength of the connecting device, which is formed on a double-sided wiring board and serves as a connecting region (a connecting terminal) to be connected to the outside, is also decreased, and thus there is the problem that the reliability of connection in a mounting double-sided wiring board in which a solder ball is mounted on a double-sided wiring board is also decreased.

Moreover, as the connecting land portions become smaller, solder joining becomes difficult, with the result that there also is the problem of a decrease in the joining strength. Furthermore, as shown in Conventional Example 3, there is the problem of air bubble entrapment.

Moreover, the improvement of the bond strength between the conductive layers on both sides of a double-sided wiring board is disclosed in, for example, three documents: JP 2002-57429A, JP 2004-281437A, and JP 2007-189125A.

SUMMARY OF THE INVENTION

The present invention was made in view of these circumstances, and it is an object thereof to provide a double-sided wiring board provided with a connecting device, wherein the connecting device includes a first-side connecting land portion configured by a first-side conductive layer and a first-side connecting conductive layer and a second-side connecting land portion configured by a second-side conductive layer, the first-side connecting land portion and the second-side connecting land portion face each other with the insulating substrate sandwiched therebetween, and a peripheral end portion of the first-side connecting land portion and a peripheral end portion of the second-side connecting land portion are connected to each other via a substrate hole that is formed corresponding to the peripheral end portion of the first-side connecting land portion and the peripheral end portion of the second-side connecting land portion, thereby improving the peel strength of the connecting device, improving the machining properties and the reliability of the connecting device, achieving a higher density, and thus providing a double-sided wiring board that is capable of high-density mounting and that is highly reliable.

Moreover, it is another object of the present invention to provide a method for manufacturing a double-sided wiring board provided with a connecting device serving as a connecting region to be connected to the outside, the double-sided wiring board including a first-side connecting conductive layer that is laminated on a first-side conductive layer and connects the first-side conductive layer and a second-side conductive layer to each other via a substrate hole formed in an insulating substrate, a first-side connecting land portion configured by the first-side conductive layer and the first-side connecting conductive layer, and a second-side connecting land portion configured by the second-side conductive layer, wherein the method includes a substrate hole forming step of forming the substrate hole by etching the first-side conductive layer and the insulating substrate with the second-side conductive layer being left intact, a connecting conductive layer forming step of forming the first-side connecting conductive layer on the first-side conductive layer and in the substrate hole by lamination and connecting the first-side conductive layer and the second-side conductive layer to each other by the first-side connecting conductive layer via the substrate hole, and a connecting land portion forming step of forming the first-side connecting land portion and the second-side connecting land portion, which face each other with the insulating substrate sandwiched therebetween, by patterning the first-side connecting conductive layer, the first-side conductive layer, and the second-side conductive layer, with a peripheral end portion of the first-side connecting land portion and a peripheral end portion of the second-side connecting land portion being connected to each other via the substrate hole, thereby providing a manufacturing method of a double-sided wiring board for easily and precisely forming a double-sided wiring board having a connecting device that is capable of improving the peel strength, improving the machining properties and the reliability, and achieving a higher density.

Moreover, it is another object of the present invention to provide a mounting double-sided wiring board including a double-sided wiring board that has a connecting device serving as a connecting region to be connected to the outside and a solder ball that is joined to the connecting device and connected to the outside, wherein the double-sided wiring board is a double-sided wiring board according to the present invention, thereby providing a mounting double-sided wiring board that is capable of improving the connection strength between the double-sided wiring board and an external portion (an external electronic component) mounted thereon and thus achieving a highly reliable connection.

A double-sided wiring board according to the present invention is a double-sided wiring board provided with a connecting device serving as a connecting region to be connected to the outside, the double-sided wiring board including an insulating substrate, a first-side conductive layer formed on a first side of the insulating substrate, a second-side conductive layer formed on a second side opposite the first side, and a first-side connecting conductive layer that is laminated on the first-side conductive layer and that connects the first-side conductive layer and the second-side conductive layer to each other via a substrate hole formed in the insulating substrate, wherein the connecting device includes a first-side connecting land portion configured by the first-side conductive layer and the first-side connecting conductive layer and a second-side connecting land portion configured by the second-side conductive layer, the first-side connecting land portion and the second-side connecting land portion face each other with the insulating substrate sandwiched therebetween, the substrate hole is formed corresponding to a peripheral end portion of the first-side connecting land portion and a peripheral end portion of the second-side connecting land portion, and the peripheral end portion of the first-side connecting land portion and the peripheral end portion of the second-side connecting land portion are connected to each other via the substrate hole.

With this configuration, the peel strength of the connecting device can be improved, so that the machining properties and the reliability of the connecting device can be improved and a higher density can be achieved. As a result, a double-sided wiring board that is capable of high-density mounting and that is highly reliable can be provided.

Moreover, in the double-sided wiring board according to the present invention, a plurality of substrate holes are formed for a single connecting device.

With this configuration, the connection area (the surface distance along the connection line) between the first-side connecting land portion and the second-side connecting land portion can be increased. As a result, the peel strength of the connecting device can be further improved, and thus the reliability can be improved.

Moreover, in the double-sided wiring board according to the present invention, a plurality of connecting devices are formed for a single substrate hole.

With this configuration, the shared use of a single substrate hole by a plurality of connecting devices is possible, so that the area of substrate holes can be reduced by reducing the number of substrate holes. Thus, sufficient strength of the insulating substrate can be secured. As a result, the peel strength of the connecting device can be further improved, and thus the reliability can be improved.

Moreover, in the double-sided wiring board according to the present invention, the first-side connecting land portion and the second-side connecting land portion are formed into polygonal shapes facing each other, and facing corners are connected to each other via the substrate hole.

With this configuration, the connection area between the first-side connecting land portion and the second-side connecting land portion can be increased, so that the connection strength is improved. As a result, the peel strength of the connecting device can be improved, and thus the reliability can be improved.

Moreover, in the double-sided wiring board according to the present invention, a central region of the first-side connecting land portion protrudes with respect to a connecting position between the first-side connecting land portion and the second-side connecting land portion connected to each other via the substrate hole.

With this configuration, when connecting to the outside, a connection area including the connection area at the protruding steps (i.e., side faces of the protrusion) in addition to the connection area at the central region of the first-side connecting land portion can be secured. As a result, the connection strength can be improved, and thus the reliability of connection to the outside can be improved.

Moreover, a manufacturing method of a double-sided wiring board according to the present invention is a method for manufacturing a double-sided wiring board provided with a connecting device serving as a connecting region to be connected to the outside, the double-sided wiring board including an insulating substrate, a first-side conductive layer formed on a first side of the insulating substrate, a second-side conductive layer formed on a second side opposite the first side, a first-side connecting conductive layer that is laminated on the first-side conductive layer and that connects the first-side conductive layer and the second-side conductive layer to each other via a substrate hole formed in the insulating substrate, a first-side connecting land portion configured by the first-side conductive layer and the first-side connecting conductive layer, and a second-side connecting land portion configured by the second-side conductive layer, wherein the method includes a substrate hole forming step of forming the substrate hole by etching the first-side conductive layer and the insulating substrate with the second-side conductive layer being left intact, a connecting conductive layer forming step of forming the first-side connecting conductive layer on the first-side conductive layer and in the substrate hole by lamination and connecting the first-side conductive layer and the second-side conductive layer to each other by the first-side connecting conductive layer via the substrate hole, and a connecting land portion forming step of forming the first-side connecting land portion and the second-side connecting land portion, which face each other with the insulating substrate sandwiched therebetween, by patterning the first-side connecting conductive layer, the first-side conductive layer, and the second-side conductive layer, with a peripheral end portion of the first-side connecting land portion and a peripheral end portion of the second-side connecting land portion being connected to each other via the substrate hole.

With this configuration, a double-sided wiring board having a connecting device that is capable of improving the peel strength, improving the machining properties and the reliability, and achieving a higher density can be formed easily and precisely.

Moreover, a mounting double-sided wiring board according to the present invention is a mounting double-sided wiring board including a double-sided wiring board that has a connecting device serving as a connecting region to be connected to the outside and a solder ball that is joined to the connecting device and connected to the outside, wherein the double-sided wiring board is a double-sided wiring board according the present invention.

With this configuration, a mounting double-sided wiring board that is capable of improving the connection strength between the double-sided wiring board and an external portion (an external electronic component) mounted thereon and thus achieving a highly reliable connection can be provided.

BRIEF DESCRIPTION OF THE DRAWINGS

FIG. 7A is a plan view showing a state in which a first-side connecting land portion and a second-side connecting land portion are formed by etching the first-side connecting conductive layer, the first-side conductive layer, the second-side connecting conductive layer, and the second-side conductive layer using the resist patterns formed on the double-sided wiring board shown in FIGS. 6A to 6C, thus completing a connecting device, FIG. 7B is an end face view as viewed from arrows B-B in FIG. 7A, and FIG. 7C is an end face view as viewed from arrows C-C in FIG. 7A.

FIG. 21A is a plan view and FIG. 21B is an end face view as viewed from arrows B-B in FIG. 21A.

FIG. 22A is a plan view and FIG. 22B is an end face view as viewed from arrows B-B in FIG. 22A.

DESCRIPTION OF THE PREFERRED EMBODIMENTS

Embodiment 1

Embodiment 1 of the double-sided wiring board and the manufacturing method thereof according to the present invention will be described with reference to FIGS. 1 to 7C.

Figure 1:
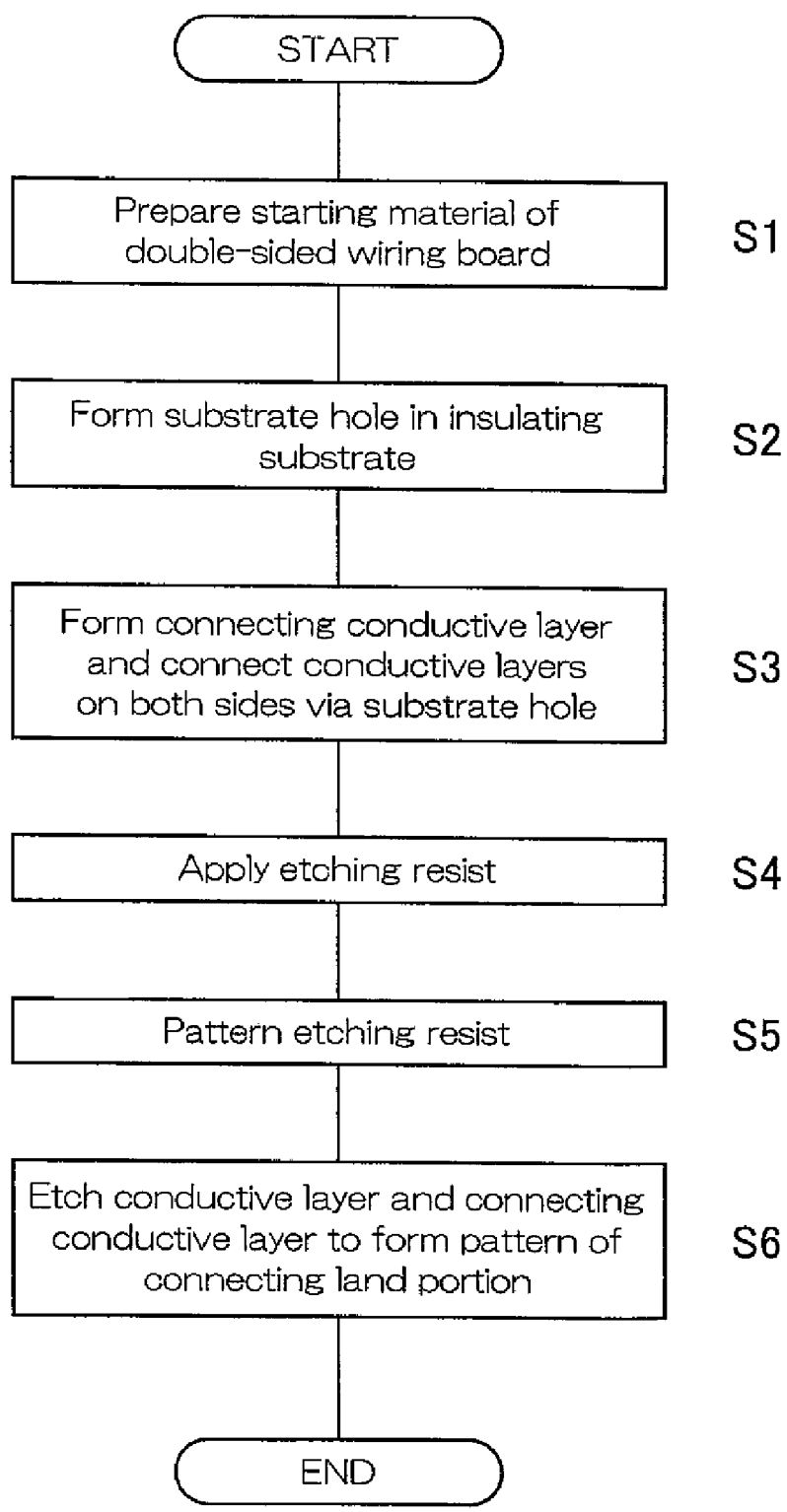
FIG. 1 is a flowchart schematically showing the process flow of a manufacturing process of a double-sided wiring board according to Embodiment 1 of the present invention.

FIG. 1 is a flowchart schematically showing the process flow of a manufacturing process of a double-sided wiring board according to Embodiment 1 of the present invention.

A double-sided wiring board 1 (see FIGS. 7A to 7C) according to Embodiment 1 can be manufactured by the process flow shown in steps S1 to S7. In the following, in conjunction with the description of steps S1 to S7, FIGS. 2 to 7C showing the state of the double-sided wiring board 1 in the respective steps of the manufacturing process will also be described.

Figure 2A:
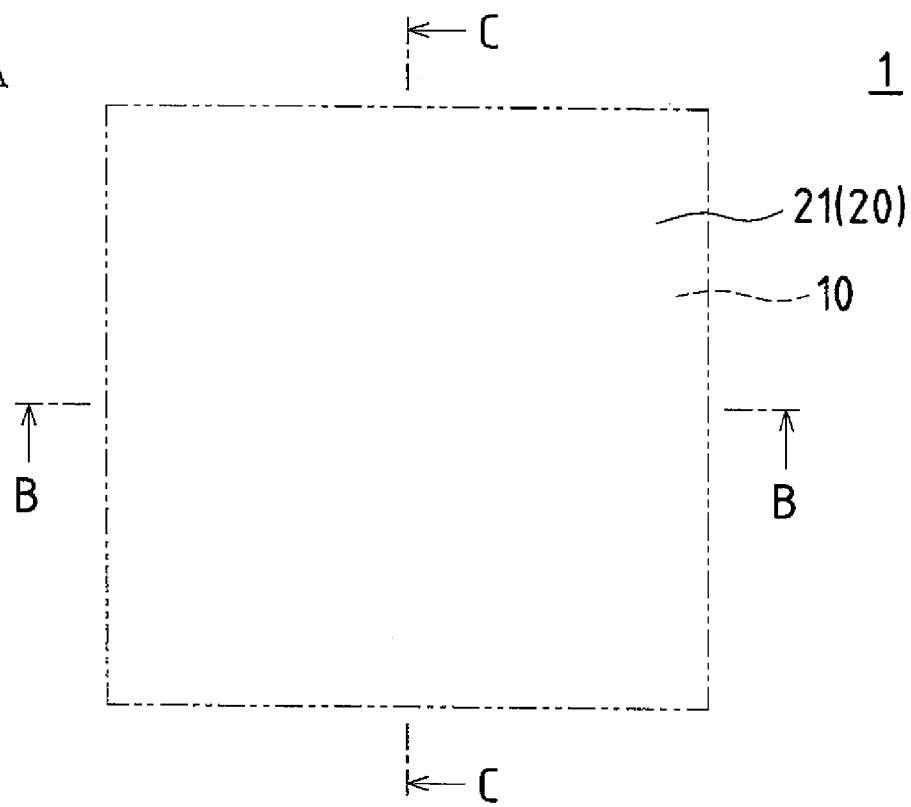
FIG. 2A is a plan view showing a starting material of the double-sided wiring board according to Embodiment 1 of the present invention.
Figure 2B:
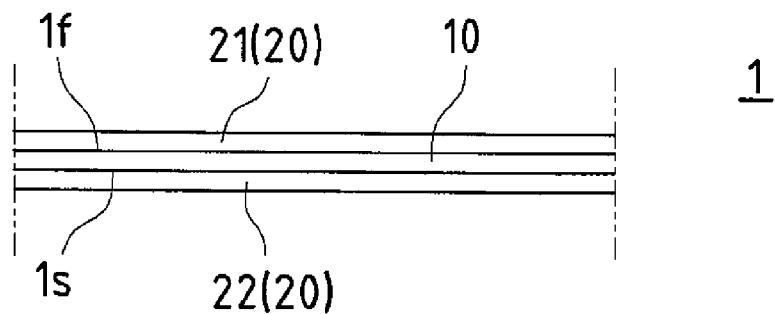
FIG. 2B is an end face view as viewed from arrows B-B in FIG. 2A.
Figure 2C:
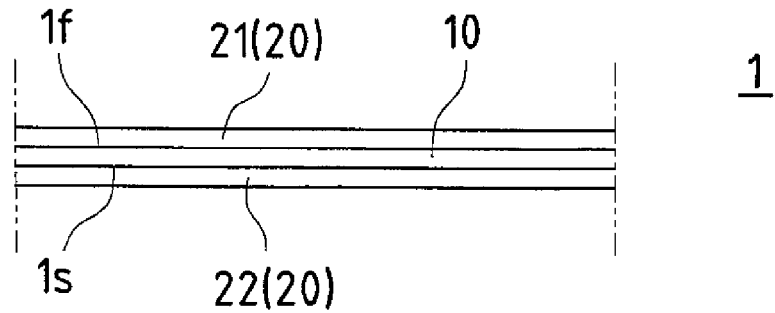
FIG. 2C is an end face view as viewed from arrows C-C in FIG. 2A.

FIG. 2A is a plan view showing a starting material of the double-sided wiring board according to Embodiment 1 of the present invention, FIG. 2B is an end face view as viewed from arrows B-B in FIG. 2A, and FIG. 2C is an end face view as viewed from arrows C-C in FIG. 2A. It should be noted that hatching is completely omitted from the end face views for clarity of illustration. This also applies to the following drawings.

Step S1:

As shown in FIGS. 2A to 2C, a starting material of the double-sided wiring board 1 is prepared. In the manufacturing process of the double-sided wiring board, the term "double-sided wiring board 1" also encompasses an uncompleted state like this starting material.

As the starting material of the double-sided wiring board 1, a double-sided wiring board 1 including an insulating substrate 10, a first-side conductive layer 21 formed on a first side 1f of the insulating substrate 10, and a second-side conductive layer 22 formed on a second side 1s opposite the first side 1f is prepared. It should be noted that when there is no need to distinguish between the first-side conductive layer 21 and the second-side conductive layer 22, these conductive layers may be referred to as conductive layers 20.

The insulating substrate 10 is formed from a thin and soft insulating film, for example. As a specific example of the material thereof, a film of about several µm to several tens of µm in thickness made of, for example, polyimide or liquid crystalline polyester can be used.

The first-side conductive layer 21 and the second-side conductive layer 22 are formed from a thin and soft metal conductor and formed by laminating the metal conductor on both sides of the insulating substrate 10. A specific example of the material thereof is a metal thin film of about several µm to several tens of µm in thickness made of, for example, copper, which is disposed by bonding, plating, vapor deposition, or the like.

Figure 3A:
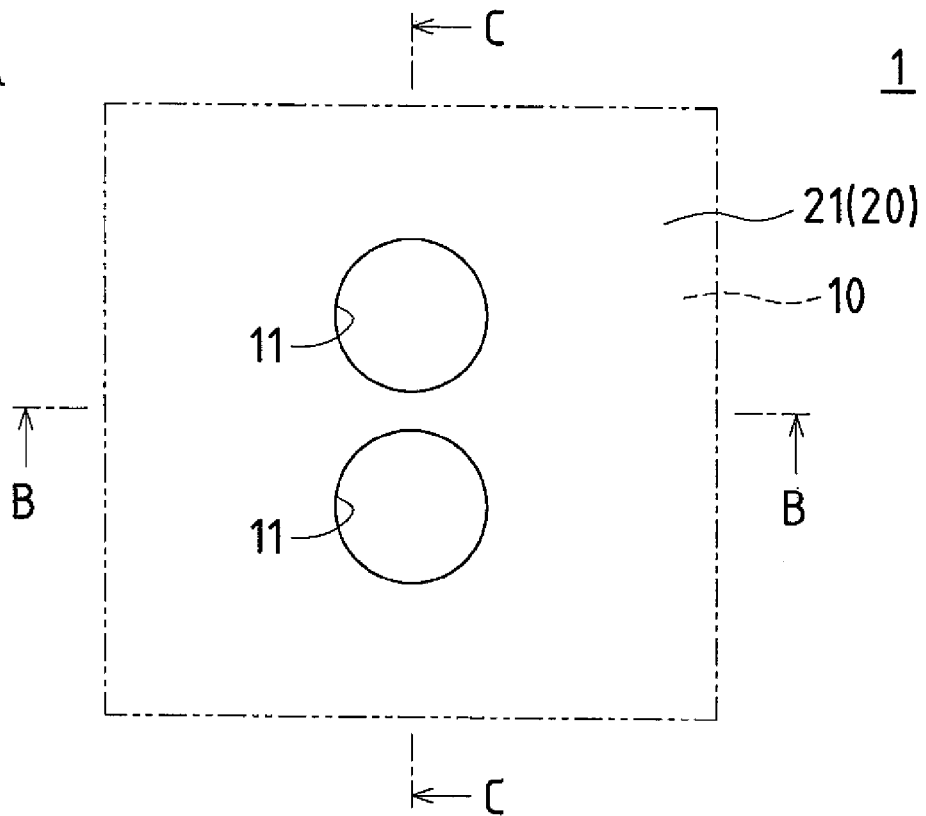
FIG. 3A is a plan view showing a state in which a substrate hole is formed in an insulating substrate of the double-sided wiring board shown in FIGS. 2A to 2C.
Figure 3B:
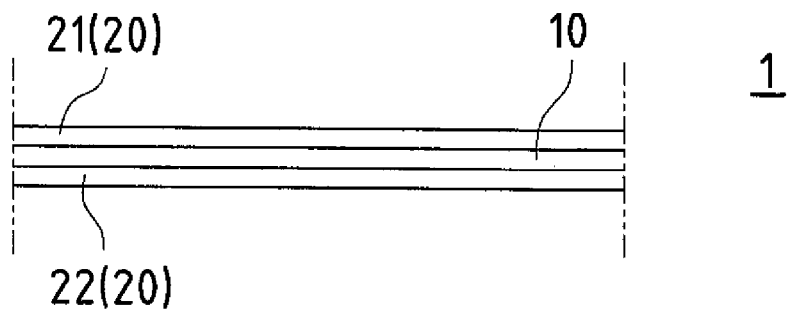
FIG. 3B is an end face view as viewed from arrows B-B in FIG. 3A.
Figure 3C:
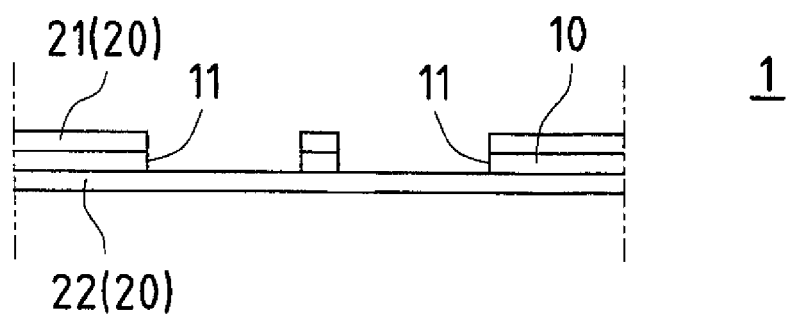
FIG. 3C is an end face view as viewed from arrows C-C in FIG. 3A.

FIG. 3A is a plan view showing a state in which a substrate hole is formed in the insulating substrate of the double-sided wiring board shown in FIGS. 2A to 2C, FIG. 3B is an end face view as viewed from arrows B-B in FIG. 3A, and FIG. 3C is an end face view as viewed from arrows C-C in FIG. 3A.

Step S2:

As shown in FIGS. 3A and 3C, for example, two circular substrate holes 11 are formed in the insulating substrate 10 of the double-sided wiring board 1 shown in FIG. 2A. That is to say, the substrate holes 11 are formed by etching the first-side conductive layer 21 and the insulating substrate 10 with the second-side conductive layer 22 being left intact (a substrate hole forming step).

The substrate holes 11 can be formed by using a technique such as laser beam machining. More specifically, for example, with carbon dioxide gas laser or the like, a non-through (the state in which the second-side conductive layer 22 is left intact) hole having a depth of several tens of µm (to several hundreds of µm) can be formed in the first-side conductive layer 21 and the insulating substrate 10. It should be noted that, alternatively, the first-side conductive layer 21 corresponding to the substrate holes 11 can be removed in advance by etching before the laser beam machining is performed.

Figure 4A:
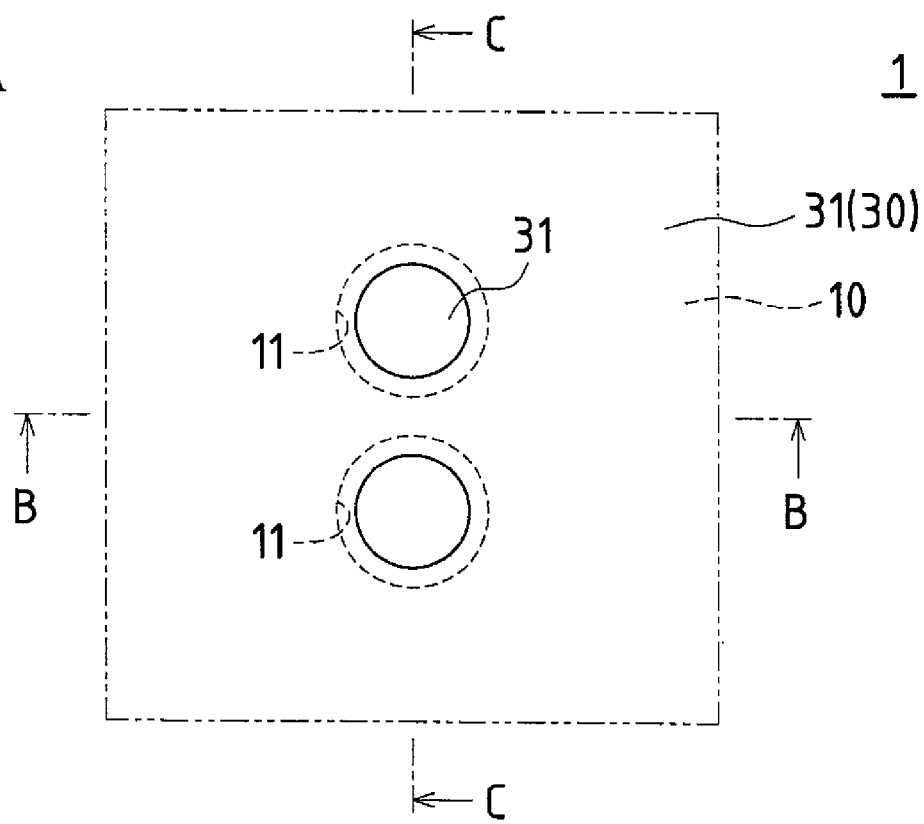
FIG. 4A is a plan view showing a state in which conductive layers on both sides of the double-sided wiring board shown in FIGS. 3A to 3C are connected to each other via a first-side connecting conductive layer formed in the substrate hole.
Figure 4B:
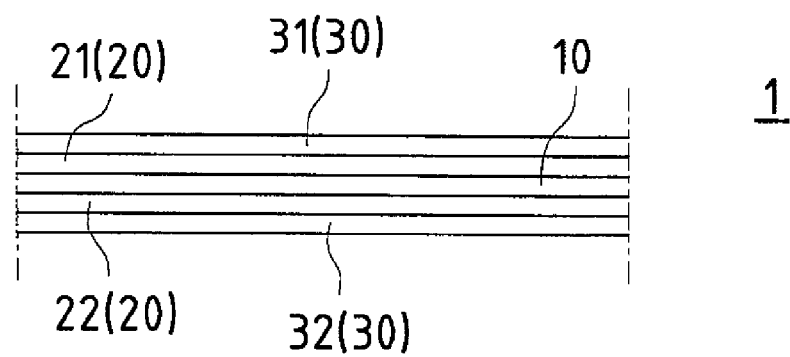
FIG. 4B is an end face view as viewed from arrows B-B in FIG. 4A.
Figure 4C:
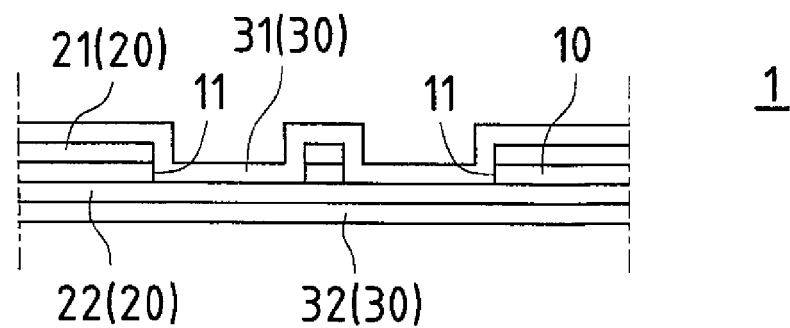
FIG. 4C is an end face view as viewed from arrows C-C in FIG. 4A.

FIG. 4A is a plan view showing a state in which the conductive layers on both sides of the double-sided wiring board shown in FIG. 3A are connected to each other via a first-side connecting conductive layer formed in the substrate holes, FIG. 4B is an end face view as viewed from arrows B-B in FIG. 4A, and FIG. 4C is an end face view as viewed from arrows C-C in FIG. 4A.

Step S3:

As shown in FIGS. 4A to 4C, a first-side connecting conductive layer 31 (a connecting conductive layer 30) is formed on the first-side conductive layer 21 and in the substrate holes 11 of the double-sided wiring board 1 shown in FIG. 3A, and the conductive layers 20 (the first-side conductive layer 21 and the second-side conductive layer 22) on both sides (the first side 1f and the second side 1s) are connected to each other by the first-side connecting conductive layer 31 via the substrate holes 11 (a connecting conductive layer forming step). That is to say, the first-side connecting conductive layer 31, which is laminated on the first-side conductive layer 21 and which connects the first-side conductive layer 21 and the second-side conductive layer 22 to each other via the substrate holes 11 formed in the insulating substrate 10, is formed.

The first-side connecting conductive layer 31 can be formed by, for example, plating the double-sided wiring board 1 (the first-side conductive layer 21). As a specific example of the material thereof a metal (e.g., copper) similar to the material of the first-side conductive layer 21 can be used. That is to say, a technique that is commonly called a conformal via can be used.

Although a state is shown in which in addition to the first-side connecting conductive layer 31, a second-side connecting conductive layer 32 has been simultaneously formed, it should be noted that formation of the second-side connecting conductive layer 32 can be omitted. Generally, the first-side connecting conductive layer 31 and the second-side connecting conductive layer 32 can be simultaneously formed by using so-called panel plating. It should be noted that when there is no need to distinguish between the first-side connecting conductive layer 31 and the second-side connecting conductive layer 32, these connecting conductive layers may be simply referred to as connecting conductive layers 30.

Figure 5A:
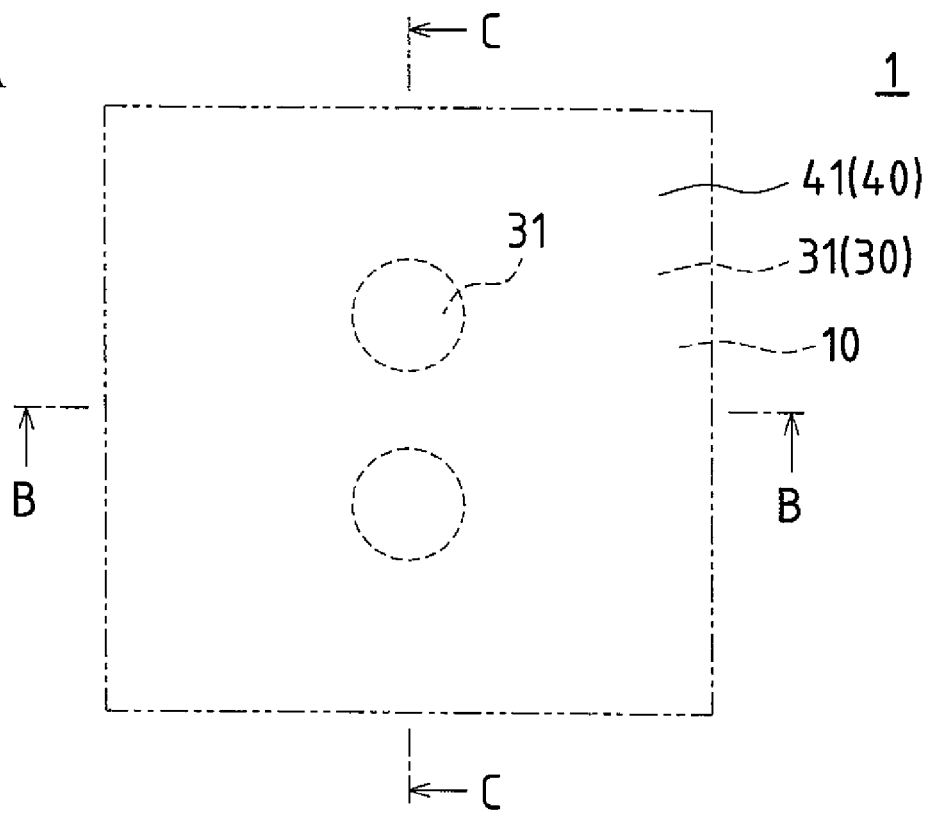
FIG. 5A is a plan view showing a state in which etching resists are applied to the first-side connecting conductive layer and a second-side connecting conductive layer formed in the double-sided wiring board shown in FIGS. 4A to 4C.
Figure 5B:
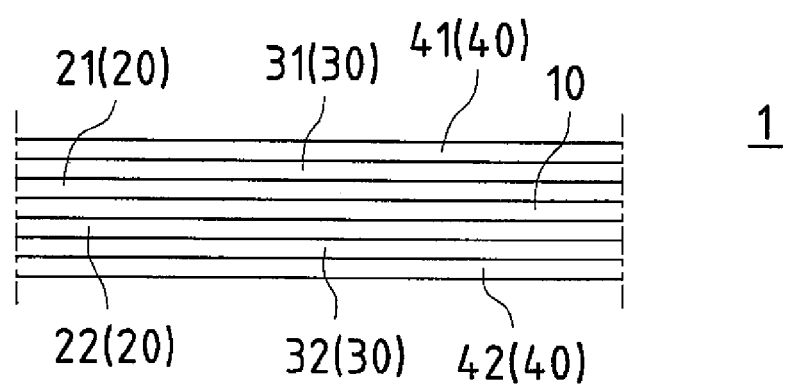
FIG. 5B is an end face view as viewed from arrows B-B in FIG. 5A.
Figure 5C:
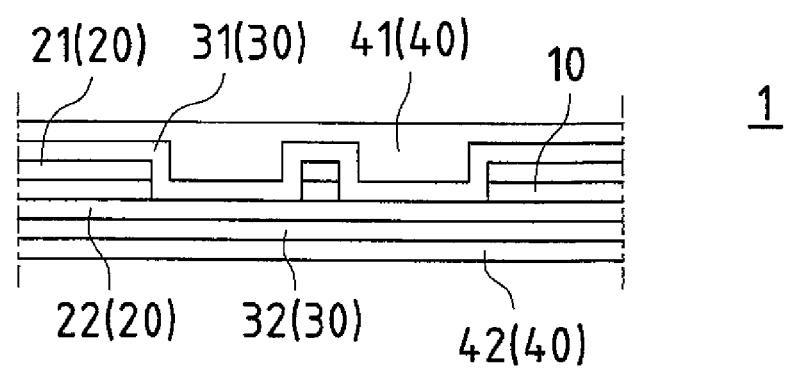
FIG. 5C is an end face view as viewed from arrows C-C in FIG. 5A.

FIG. 5A is a plan view showing a state in which etching resists are applied to the first-side connecting conductive layer and the second-side connecting conductive layer formed in the double-sided wiring board shown in FIGS. 4A to 4C, FIG. 5B is an end face view as viewed from arrows B-B in FIG. 5A, and FIG. 5C is an end face view as viewed from arrows C-C in FIG. 5A.

Step S4:

As shown in FIGS. 5A to 5C, etching resists (a first-side etching resist 41 and a second-side etching resist 42) are applied to the first-side connecting conductive layer 31 and the second-side connecting conductive layer 32 of the double-sided wiring board 1 shown in FIGS. 4A to 4C (an etching resist applying step). It should be noted that when there is no need to distinguish between the first-side etching resist 41 and the second-side etching resist 42, these etching resists are simply referred to as etching resists 40.

The first-side etching resist 41 and the second-side etching resist 42 can be formed in a thickness of about several μm to several tens of μm, for example. More specifically, it is preferable, for example, to apply an etching resist in the liquid state or to attach a dry film that is soft and can be embedded under a reduced-pressure/vacuum, thereby applying the etching resist or embedding the dry film so as to follow the inner wall of the substrate holes 11. Preferably, the thickness of the etching resists 40 is such that the shape (planarity) of the etching resists 40 can be reproduced without being affected by protrusions/depressions (steps) of the substrate holes 11.

Figure 6A:
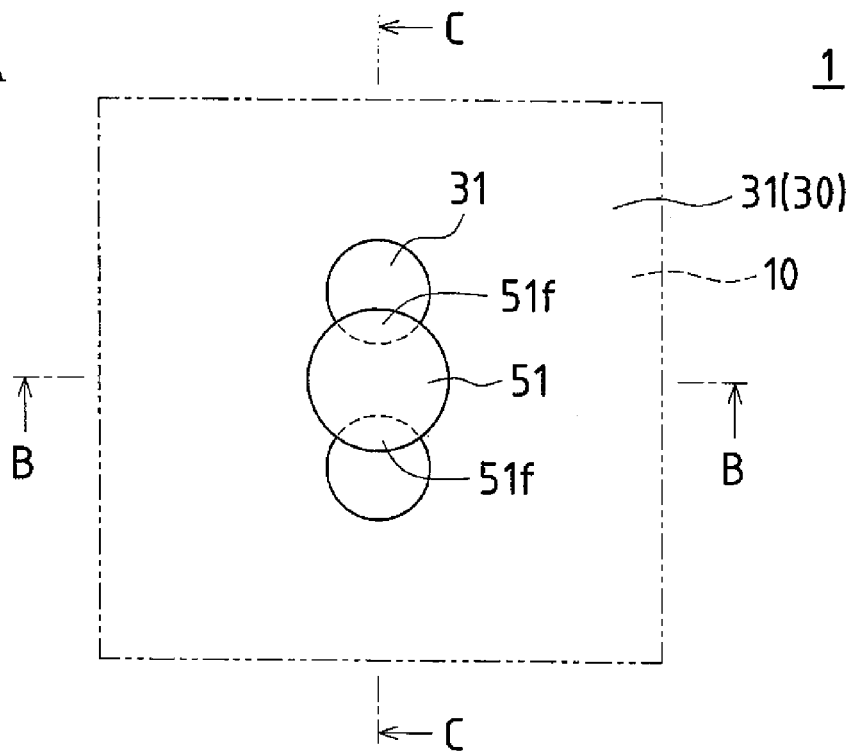
FIG. 6A is a plan view showing a state in which the etching resists formed on the double-sided wiring board shown in FIGS. 5A to 5C are patterned.
Figure 6B:
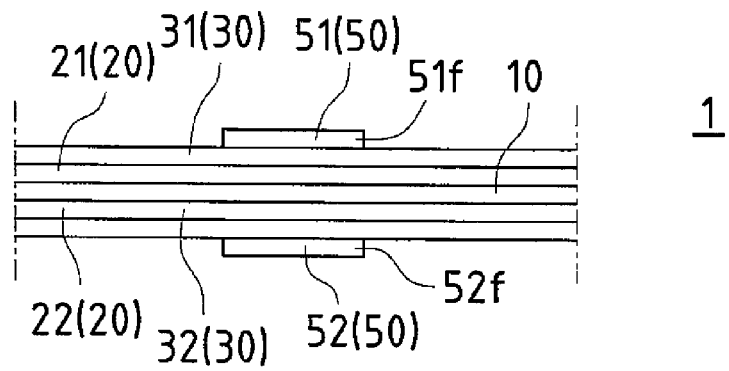
FIG. 6B is an end face view as viewed from arrows B-B in FIG. 6A.
Figure 6C:
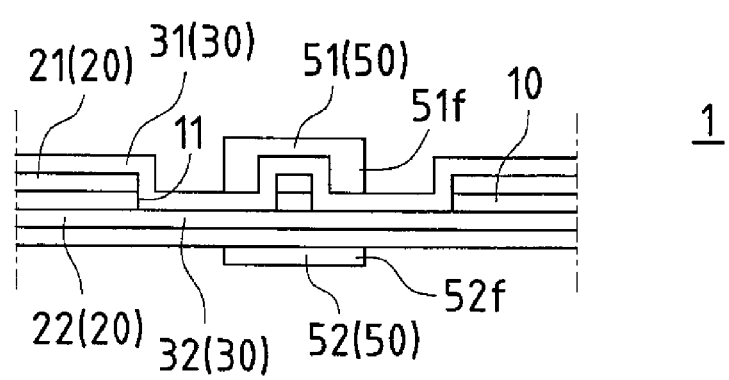
FIG. 6C is an end face view as viewed from arrows C-C in FIG. 6A.

FIG. 6A is a plan view showing a state in which the etching resists formed on the double-sided wiring board shown in FIGS. 5A to 5C are patterned, FIG. 6B is an end face view as viewed from arrows B-B in FIG. 6A, and FIG. 6C is an end face view as viewed from arrows C-C in FIG. 6A.

Step S5:

As shown in FIGS. 6A to 6C, the etching resists (the first-side etching resist 41 and the second-side etching resist 42) formed on both sides of the double-sided wiring board 1 shown in FIGS. 5A to 5C are patterned using photolithography (a resist patterning step).

FIGS. 6A to 6C show a state in which a first-side resist pattern 51 and a second-side resist pattern 52 that have, for example, a circular shape and are disposed so that peripheral end portions 51f and 52f overlap the substrate holes 11 are formed. It should be noted that when there is no need to distinguish between the first-side resist pattern 51 and the second-side resist pattern 52, these resist patterns may be simply referred to as resist patterns 50. Moreover, the first-side resist pattern 51 and the second-side resist pattern 52 are symmetrically formed in positions facing each other with the insulating substrate 10 interposed therebetween. The degree of symmetry is not required to be so high that these resist patterns completely coincide with each other.

Exposure of the etching resists 40 can be performed using, for example, parallel light exposure or projection exposure. Moreover, it is preferable that the first-side resist pattern 51 and the second-side resist pattern 52 are precisely aligned with each other using an automatic recognition system or the like.

FIG. 7A is a plan view showing a state in which a first-side connecting land portion and a second-side connecting land portion are formed by etching the first-side connecting conductive layer, the first-side conductive layer, the second-side connecting conductive layer, and the second-side conductive layer using the resist patterns formed on the double-sided wiring board shown in FIGS. 6A to 6C, thus completing a connecting device, FIG. 7B is an end face view as viewed from arrows B-B in FIG. 7A, and FIG. 7C is an end face view as viewed from arrows C-C in FIG. 7A.

Step S6:

As shown in FIGS. 7A to 7C, photolithography is performed using the resist patterns 50 (the first-side resist pattern 51 and the second-side resist pattern 52) formed on both sides of the double-sided wiring board 1 shown in FIGS. 6A to 6C as etching masks.

That is to say, by performing patterning by etching the conductive layers 20 (the first-side conductive layer 21 and the second-side conductive layer 22) and the connecting conductive layers 30 (the first-side connecting conductive layer 31 and the second-side connecting conductive layer 32), connecting land portions 60 (a first-side connecting land portion 61 configured by the first-side conductive layer 21 and the first-side connecting conductive layer 31 and a second-side connecting land portion 62 configured by the second-side conductive layer 22 and the second-side connecting conductive layer 32) facing each other at respective central portions with the insulating substrate 10 sandwiched therebetween are formed (a connecting land portion forming step).

It should be noted that when there is no need to distinguish between the first-side connecting land portion 61 and the second-side connecting land portion 62, these connecting land portions may be simply referred to as the connecting land portions 60. Moreover, when the second-side connecting conductive layer 32 is not formed, the second-side connecting land portion 62 is configured by the second-side conductive layer 22.

FIGS. 7A to 7C show a state in which the resist patterns are removed. Moreover, as described above, the second-side connecting conductive layer 32 can be formed simultaneously with the first-side connecting conductive layer 31, though this is not an essential requirement. By forming the second-side connecting conductive layer 32 simultaneously with the first-side connecting conductive layer 31, the strength of the second-side connecting land portion 62 can be improved.

Moreover, in the connecting land portion forming step, peripheral end portions 61f of the first-side connecting land portion 61 and peripheral end portions 62f of the second-side connecting land portion 62 are connected to each other via the substrate holes 11, thereby configuring a connecting device 1cd. That is to say, the connecting device 1cd according to Embodiment 1 has a configuration in which a single circular connecting land portion 60 (the first-side connecting land portion 61 and the second-side connecting land portion 62) is provided for two circular substrate holes 11.

Therefore, a double-sided wiring board 1 having a connecting device led that is capable of improving the peel strength, improving the machining properties and the reliability, and achieving a higher density can be formed easily and precisely.

Although FIGS. 7A to 7C show the independent connecting device 1cd, which is not connected to other wiring portions, wiring lead patterns 61p and 62p (see FIG. 8A and subsequent drawings) appropriately connected to other wiring portions can be formed in order to allow the connecting device 1cd to function as an actual connecting device 1cd.

It is preferable that etching of the conductive layers 20 (the first-side conductive layer 21 and the second-side conductive layer 22) and the connecting conductive layer 30 (the first-side connecting conductive layer 31 and the second-side connecting conductive layer 32) is performed in such a manner that the shape of the patterns of the connecting land portions 60 is reproduced without being affected by protrusions/depressions of the substrate holes 11 by, for example, adjusting the etching conditions of the top side and the bottom side.

Moreover, in order to precisely form the patterns of the connecting land portions 60, it is preferable that the protrusions/depressions (steps) of the substrate holes 11 are small. That is to say, the insulating substrate 10 and the first-side conductive layer 21 in which the substrate holes 11 are formed are preferably as thin as possible.

As described above, the manufacturing method of the double-sided wiring board 1 according to Embodiment 1 is a method for manufacturing a double-sided wiring board 1 provided with a connecting device 1cd serving as a connecting region to be connected to the outside, the double-sided wiring board 1 including an insulating substrate 10, a first-side conductive layer 21 formed on a first side 1f of the insulating substrate 10, a second-side conductive layer 22 formed on a second side 1s opposite the first side 1f, a first-side connecting conductive layer 31 that is laminated on the first-side conductive layer 21 and that connects the first-side conductive layer 21 and the second-side conductive layer 22 to each other via a substrate hole 11 formed in the insulating substrate 10, a first-side connecting land portion 61 configured by the first-side conductive layer 21 and the first-side connecting conductive layer 31, and a second-side connecting land portion 62 configured by the second-side conductive layer 22, wherein the method includes a substrate hole forming step, a connecting conductive layer forming step, and a connecting land portion forming step.

Moreover, the double-sided wiring board 1 according to Embodiment 1 is a double-sided wiring board 1 provided with a connecting device 1cd serving as a connecting region to be connected to the outside, the double-sided wiring board 1 including an insulating substrate 10, a first-side conductive layer 21 formed on a first side 1f of the insulating substrate 10, a second-side conductive layer 22 formed on a second side 1s opposite the first side 1f, and a first-side connecting conductive layer 31 that is laminated on the first-side conductive layer 21 and that connects the first-side conductive layer 21 and the second-side conductive layer 22 to each other via a substrate hole 11 formed in the insulating substrate 10, wherein the connecting device 1cd includes a first-side connecting land portion 61 configured by the first-side conductive layer 21 and the first-side connecting conductive layer 31 and a second-side connecting land portion 62 configured by the second-side conductive layer 22, the first-side connecting land portion 61 and the second-side connecting land portion 62 face each other at respective central portions with the insulating substrate 10 sandwiched therebetween, the substrate hole 11 is formed corresponding to a peripheral end portion 61f of the first-side connecting land portion 61 and a peripheral end portion 62f of the second-side connecting land portion 62, and the peripheral end portion 61f of the first-side connecting land portion 61 and the peripheral end portion 62f of the second-side connecting land portion 62 are connected to each other via the substrate hole 11.

With this configuration, the peel strength of the connecting device 1cd can be improved, so that the machining properties and the reliability of the connecting device 1cd can be improved and a higher density can be achieved. As a result, a double-sided wiring board 1 that is capable of high-density mounting and that is highly reliable can be provided.

Moreover, in the double-sided wiring board 1 according to Embodiment 1, a plurality (e.g., two in FIG. 7A) of substrate holes 11 are formed for a single connecting device 1cd.

Accordingly, the connection area (the surface distance along the connection line) between the first-side connecting land portion 61 and the second-side connecting land portion 62 can be increased. Thus, the peel strength of the connecting device 1cd can be further improved, and the reliability can be improved.

Moreover, in the double-sided wiring board 1 according to Embodiment 1, a central region of the first-side connecting land portion 61 protrudes with respect to a connecting position between the first-side connecting land portion 61 and the second-side connecting land portion 62 in the substrate hole 11 (see FIG. 7C).

Therefore, when connecting to the outside, a connection area including the connection area at the protruding steps (i.e., side faces of the protrusion, the steps produced in the first-side connecting land portion 61 by the insulating substrate 10 and the first-side conductive layer 21) in addition to the connection area at the central region of the first-side connecting land portion 61 can be secured. As a result, the connection strength can be improved, and thus the reliability of connection to the outside can be improved.

Moreover, due to the improved connection strength, the area of the connecting device 1cd can be made even smaller, and therefore high-density wiring and high-density mounting can be achieved.

Embodiment 2

Next, Embodiment 2 of the double-sided wiring board according to the present invention will be described with reference to FIGS. 8A to 17.

Figure 8A:
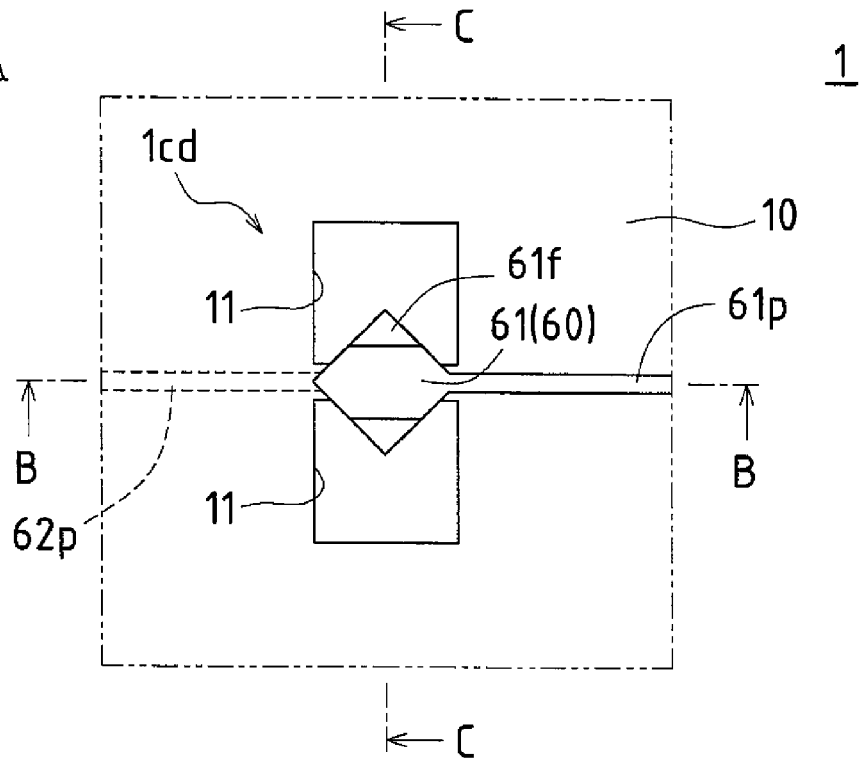
FIG. 8A is a plan view showing Example 1 of a double-sided wiring board according to Embodiment 2 of the present invention.
Figure 8B:
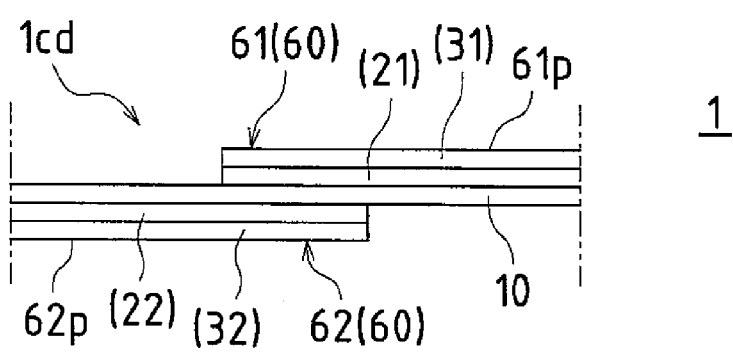
FIG. 8B is an end face view as viewed from arrows B-B in FIG. 8A.
Figure 8C:
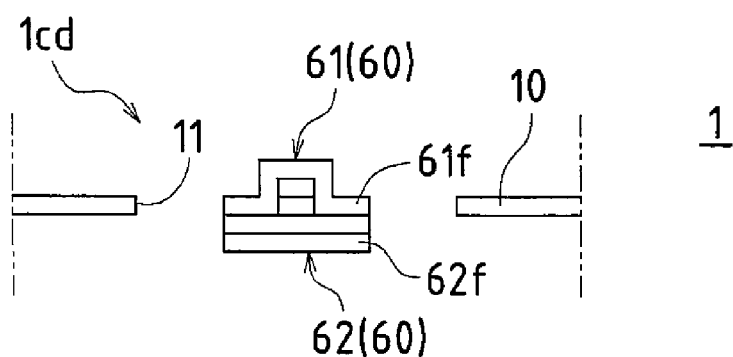
FIG. 8C is an end face view as viewed from arrows C-C in FIG. 8A.

FIG. 8A is a plan view showing Example 1 of a double-sided wiring board according to Embodiment 2 of the present invention, FIG. 8B is an end face view as viewed from arrows B-B in FIG. 8A, and FIG. 8C is an end face view as viewed from arrows C-C in FIG. 8A.

In a double-sided wiring board 1 (a connecting device 1cd) according to Example 1, two rectangular substrate holes 11 are formed so that the two substrate holes 11 are arranged with respective sides facing each other, and a single rectangular connecting land portion 60 (a first-side connecting land portion 61 and a second-side connecting land portion 62) is provided on an insulating substrate 10 between the facing sides.

Accordingly, the rectangular shape of the connecting land portion 60 is tilted at 45° with respect to the rectangular shape of the substrate holes 11, and corners corresponding to two vertices of the four vertices of the connecting land portion 60 form peripheral end portions 61f in which the first-side connecting land portion 61 and the second-side connecting land portion 62 are connected to each other via the substrate holes 11. That is to say, the same effects as in Embodiment 1 are obtained.

Moreover, a single wiring lead pattern 61p is formed for the first-side connecting land portion 61, and a single wiring lead pattern 62p is formed for the second-side connecting land portion 62. That is to say, both of the first-side connecting land portion 61 and the second-side connecting land portion 62 are in a state in which they are connected to other wiring portions of the double-sided wiring board 1.

Figure 9A:
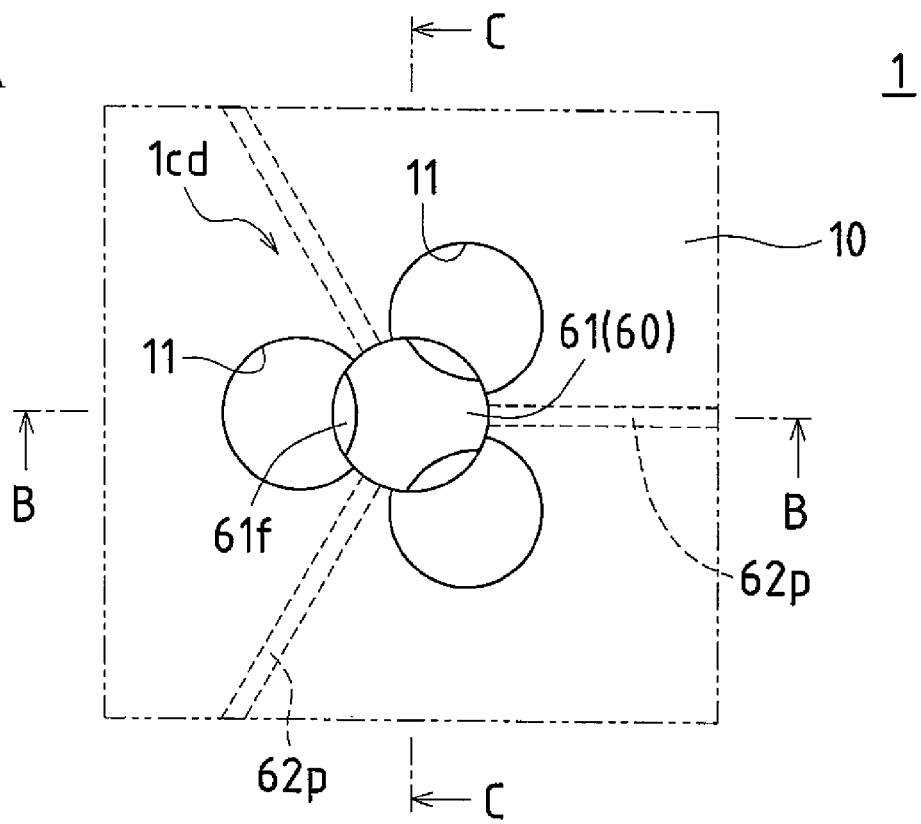
FIG. 9A is a plan view showing Example 2 of the double-sided wiring board according to Embodiment 2 of the present invention.
Figure 9B:
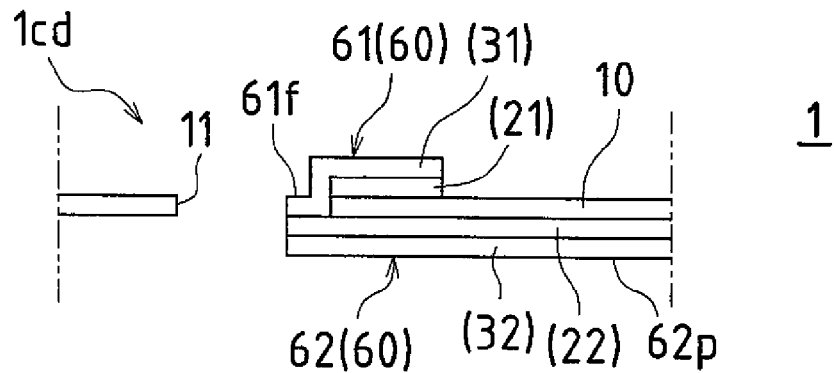
FIG. 9B is an end face view as viewed from arrows B-B in FIG. 9A.
Figure 9C:
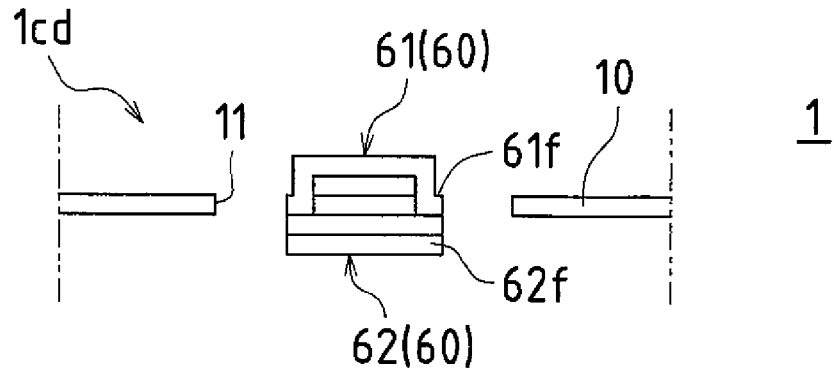
FIG. 9C is an end face view as viewed from arrows C-C in FIG. 9A.

FIG. 9A is a plan view showing Example 2 of the double-sided wiring board according to Embodiment 2 of the present invention, FIG. 9B is an end face view as viewed from arrows B-B in FIG. 9A, and FIG. 9C is an end face view as viewed from arrows C-C in FIG. 9A.

In a double-sided wiring board 1 (a connecting device 1cd) according to Example 2, three circular substrate holes 11 are formed so that the three substrate holes 11 are arranged facing one another with the respective centers being located at the vertices of a triangle, and a single circular connecting land portion 60 (a first-side connecting land portion 61 and a second-side connecting land portion 62) is provided on an insulating substrate 10 at a center position of the triangle.

Accordingly, the circular shape of the connecting land portion 60 is disposed so as to overlap the circular shape of the substrate holes 11 in such a manner that the overlaps are spaced at angles of 120° from each other around the center of the connecting land portion 60, and peripheral end portions 61f in which the first-side connecting land portion 61 and the second-side connecting end portion 62 are connected to each other are formed at positions spaced at angles of 120°. That is to say, the same effects as in Example 1 are obtained.

Moreover, the first-side connecting land portion 61 is independently disposed without being provided with a wiring lead pattern 61p. Three wiring lead patterns 62p are formed for the second-side connecting land portion 62, and thus the second-side connecting land portion 62 is in a state in which it is connected to other wiring portions of the double-sided wiring board 1.

By changing the arrangement of the three substrate holes 11, an optimal connection pattern with respect to other wiring portions of the double-sided wiring board 1 can be formed.

Figure 10A:
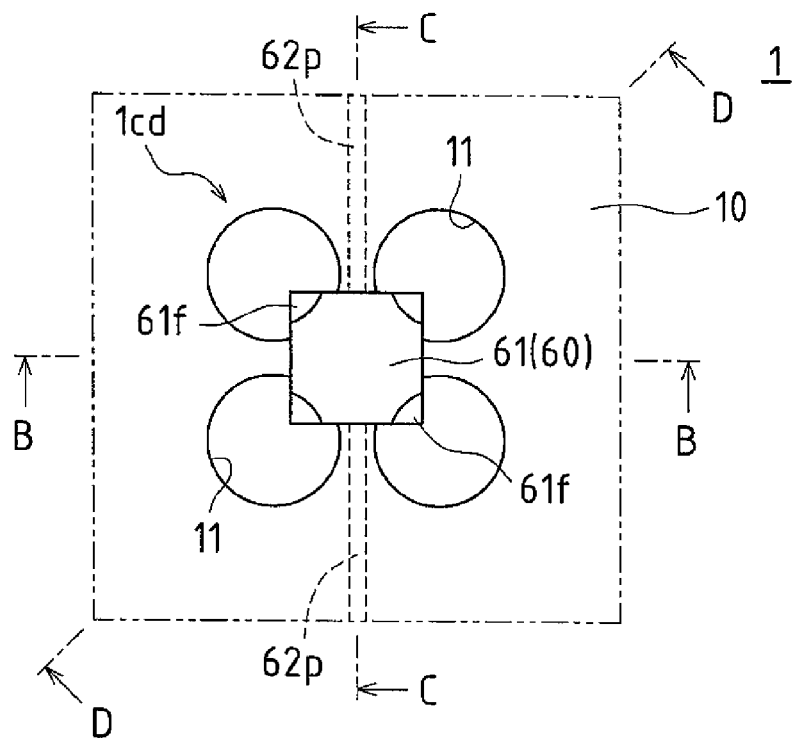
FIG. 10A is a plan view showing Example 3 of the double-sided wiring board according to Embodiment 2 of the present invention.
Figure 10B:
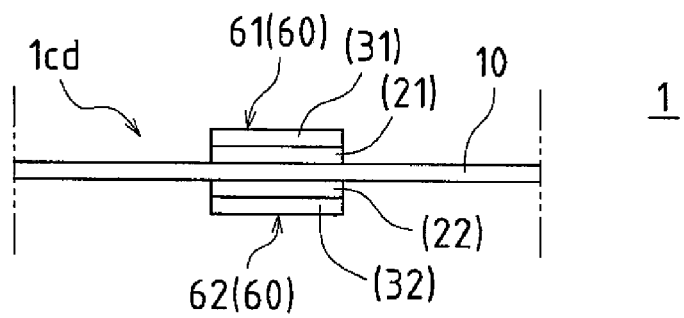
FIG. 10B is an end face view as viewed from arrows B-B in FIG. 10A.
Figure 10C:
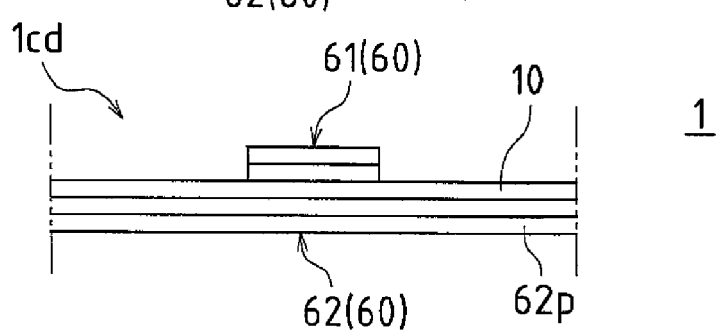
FIG. 10C is an end face view as viewed from arrows C-C in FIG. 10A.
Figure 10D:
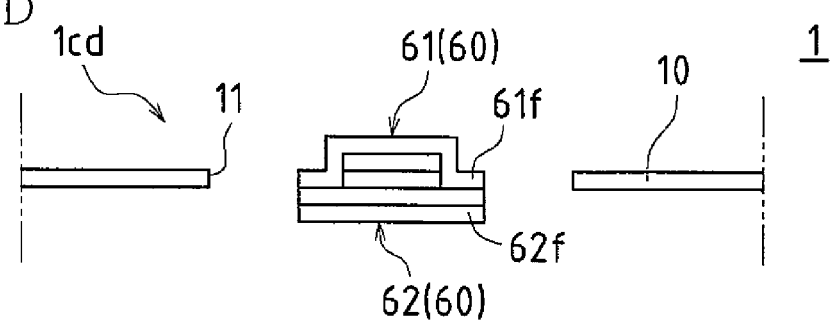
FIG. 10D is an end face view as viewed from arrows D-D in FIG. 10A.

FIG. 10A is a plan view showing Example 3 of the double-sided wiring board according to Embodiment 2 of the present invention, FIG. 10B is an end face view as viewed from arrows B-B in FIG. 10A, FIG. 10C is an end face view as viewed from arrows C-C in FIG. 10A, and FIG. 10D is an end face view as viewed from arrows D-D in FIG. 10A.

In a double-sided wiring board 1 (a connecting device 1cd) according to Example 3, four circular substrate holes 11 are formed so that the four substrate holes 11 are arranged facing one another with the respective centers being located at the vertices of a square, and a single square connecting land portion 60 (a first-side connecting land portion 61 and a second-side connecting land portion 62) is provided on an insulating substrate 10 at a center position of the square.

Accordingly, the square of the connecting land portion 60 is disposed so that the vertices of the square respectively overlap the circular shape of the substrate holes 11, and corners corresponding to the vertices of the square form peripheral end portions 61f in which the first-side connecting land portion 61 and the second-side connecting land portion 62 are connected to each other. That is to say, the same effects as in Example 1 are obtained.

Moreover, the first-side connecting land portion 61 is independently disposed without being provided with a wiring lead pattern 61p. Two wiring lead patterns 62p are formed for the second-side connecting land portion 62, and thus the second-side connecting land portion 62 is in a state in which it is connected to other wiring portions of the double-sided wiring board 1.

In the connecting land portion 60, the first-side connecting land portion 61 and the second-side connecting land portion 62 are connected to each other at the peripheral end portions 61f and peripheral end portions 62f, which are disposed in the four directions, so that a well-balanced and stronger connection can be achieved. It should be noted that the shape of the connecting land portion 60 can also be a quadrilateral other than a square, such as a rectangle.

Figure 11A:
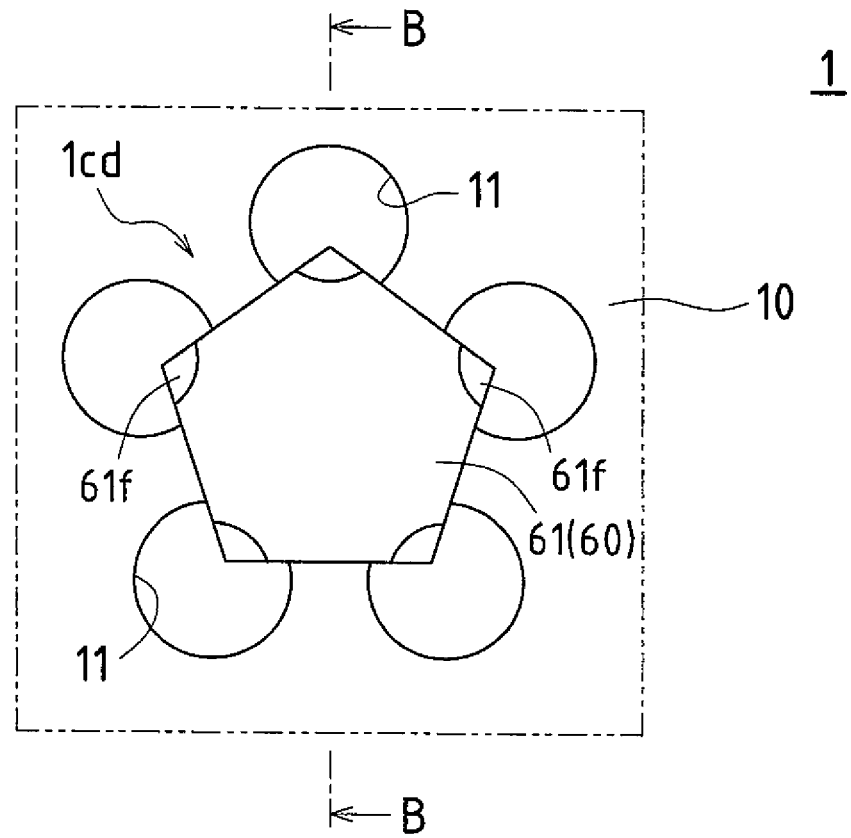
FIG. 11A is a plan view showing Example 4 of the double-sided wiring board according to Embodiment 2 of the present invention.
Figure 11B:
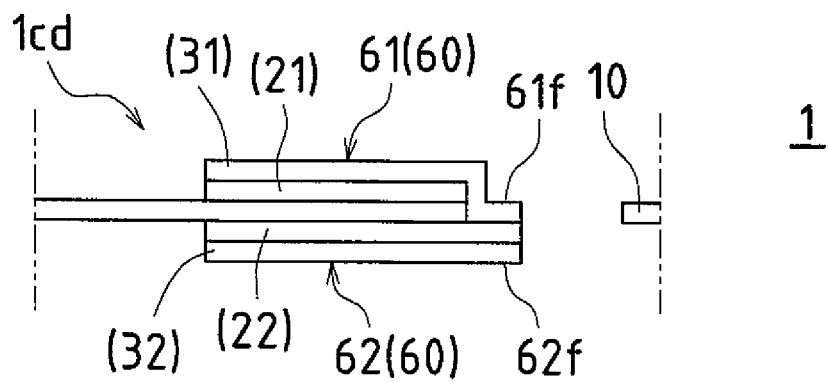
FIG. 11B is an end face view as viewed from arrows B-B in FIG. 11A.

FIG. 11A is a plan view showing Example 4 of the double-sided wiring board according to Embodiment 2 of the present invention, and FIG. 11B is an end face view as viewed from arrows B-B in FIG. 11A.

In a double-sided wiring board 1 (a connecting device 1cd) according to Example 4, five circular substrate holes 11 are formed so that the five substrate holes 11 are arranged facing one another with the respective centers being located at the vertices of a pentagon, and a single pentagonal connecting land portion 60 (a first-side connecting land portion 61 and a second-side connecting land portion 62) is provided on an insulating substrate 10 at a center position among the five substrate holes 11.

Accordingly, the pentagon of the connecting land portion 60 is disposed so that the vertices of the pentagon respectively overlap the circular shape of the substrate holes 11, and corners corresponding to the vertices of the pentagon form peripheral end portions 61f in which the first-side connecting land portion 61 and the second-side connecting land portion 62 are connected to each other. That is to say, the same effects as in Example 1 are obtained.

Moreover, although a case where neither a wiring lead pattern 61p nor a wiring lead pattern 62p is formed is shown, the wiring patterns can be formed by appropriately using the insulating substrate 10 between the substrate holes 11.

As shown in Example 3 or 4, by forming a polygonal connecting land portion 60 and disposing peripheral end portions 61f and 62f at each of the vertices of the polygon, the connection area between the first-side connecting land portion 61 and the second-side connecting land portion 62 can be increased.

That is to say, it is desirable that the first-side connecting land portion 61 and the second-side connecting land portion 62 are formed into polygonal shapes facing each other and connected to each other at facing corners via the substrate holes 11. With this configuration, the connection area between the first-side connecting land portion 61 and the second-side connecting land portion 62 can be increased. Thus, the connection strength can be improved. As a result, the peel strength of the connecting device 1cd can be further improved, and thus the reliability can be improved.

Figure 12:
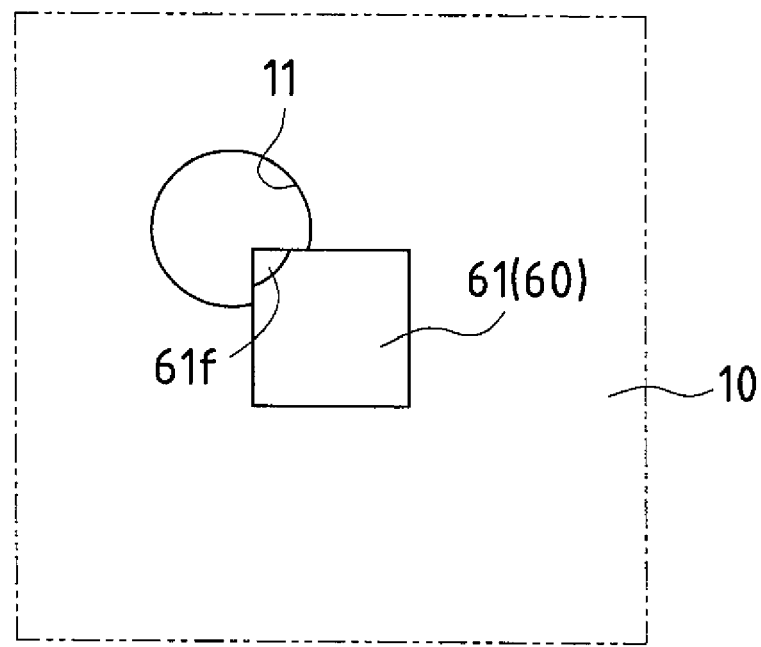
FIG. 12 is a plan view showing Example 5 of the double-sided wiring board according to Embodiment 2 of the present invention.

FIG. 12 is a plan view showing Example 5 of the double-sided wiring board according to Embodiment 2 of the present invention.

In a double-sided wiring board 1 (a connecting device 1cd) according to Example 5, a single circular substrate hole 11 is formed so that the single substrate hole 11 is disposed corresponding to a vertex of a square (a quadrilateral), and a single square connecting land portion 60 (a first-side connecting land portion 61 and a second-side connecting land portion 62) is provided on an insulating substrate 10.

Accordingly, the square of the connecting land portion 60 is disposed so that a vertex of the square overlaps the circular shape of the substrate hole 11, and a corner corresponding to the vertex of the square forms a peripheral end portion 61f in which the first-side connecting land portion 61 and the second-side connecting land portion 62 are connected to each other. That is to say, the same effects as in Example 1 are obtained.

It should be noted that the end-face shape of this double-sided wiring board 1 is similar to that of the above-described double-sided wiring boards 1 (see FIGS. 8A to 11B) according to Embodiment 2, and thus is omitted from FIG. 12. Moreover, although a case where neither a wiring lead pattern 61*p* nor a wiring lead pattern 62*p* is formed is shown, the wiring patterns can be formed by appropriately using the insulating substrate 10.

Figure 13:
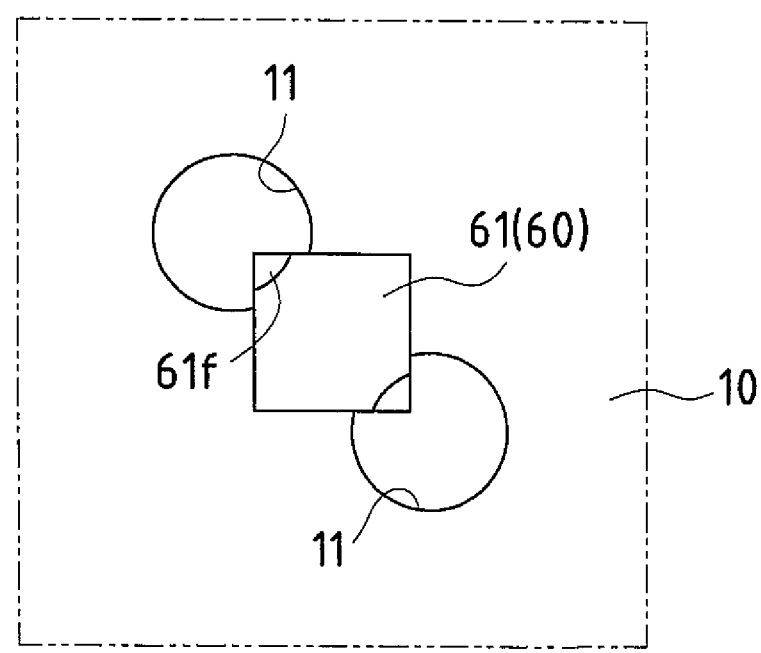
FIG. 13 is a plan view showing Example 6 of the double-sided wiring board according to Embodiment 2 of the present invention.

FIG. 13 is a plan view showing Example 6 of the double-sided wiring board according to Embodiment 2 of the present invention.

In a double-sided wiring board 1 (a connecting device 1*cd*) according to Example 6, two circular substrate holes 11 are formed so that the two substrate holes 11 are arranged corresponding to two vertices on a diagonal of a square (a quadrilateral), and a single square connecting land portion 60 (a first-side connecting land portion 61 and a second-side connecting land portion 62; however, the second-side connecting land portion 62 is not shown) is provided on an insulating substrate 10.

Accordingly, the square of the connecting land portion 60 is disposed so that the vertices on the diagonal of the square respectively overlap the circular shape of the substrate holes 11, and corners corresponding to those vertices on the diagonal of the square form peripheral end portions 61*f* in which the first-side connecting land portion 61 and the second-side connecting land portion 62 are connected to each other. That is to say, the same effects as in Example 1 are obtained.

It should be noted that the end-face shape of this double-sided wiring board 1 is similar to that of the above-described double-sided wiring boards 1 (see FIGS. 8A to 11B) according to Embodiment 2, and thus is omitted from FIG. 13. Moreover, although a case where neither a wiring lead pattern 61*p* nor a wiring lead pattern 62*p* is formed is shown, the wiring patterns can be formed by appropriately using the insulating substrate 10.

Figure 14:
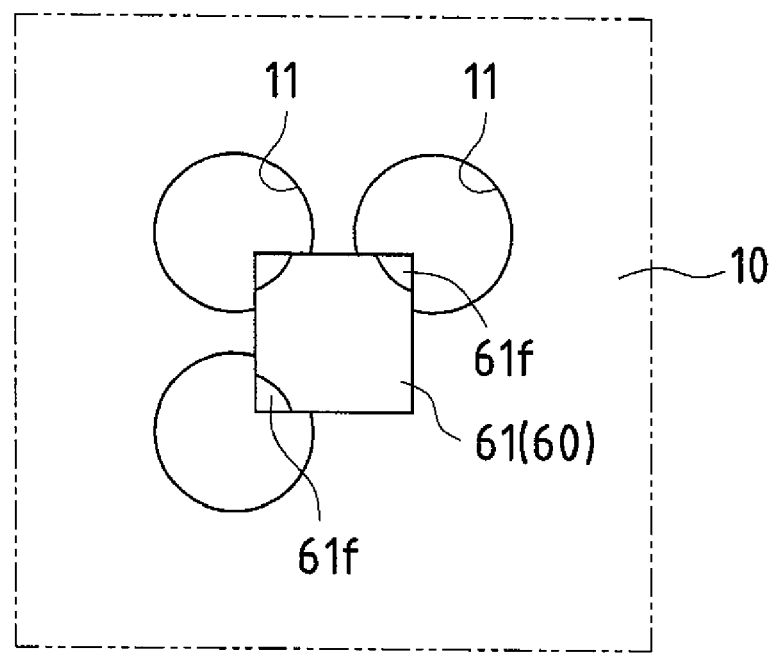
FIG. 14 is a plan view showing Example 7 of the double-sided wiring board according to Embodiment 2 of the present invention.

FIG. 14 is a plan view showing Example 7 of the double-sided wiring board according to Embodiment 2 of the present invention.

In a double-sided wiring board 1 (a connecting device 1*cd*) according to Example 7, three circular substrate holes 11 are formed so that the three substrate holes 11 are arranged corresponding to three vertices of a square (a quadrilateral), and a single square connecting land portion 60 (a first-side connecting land portion 61 and a second-side connecting land portion 62; however, the second-side connecting land portion 62 is not shown) is provided on an insulating substrate 10.

Accordingly, the square of the connecting land portion 60 is disposed so that the three vertices among the four vertices of the square respectively overlap the circular shape of the substrate holes 11, and corners corresponding to those three vertices of the square form peripheral end portions 61*f* in which the first-side connecting land portion 61 and the second-side connecting land portion 62 are connected to each other. That is to say, the same effects as in Example 1 are obtained.

It should be noted that the end-face shape of this double-sided wiring board 1 is similar to that of the above-described double-sided wiring boards 1 (see FIGS. 8A to 11B) according to Embodiment 2, and thus is omitted from FIG. 14. Moreover, although a case where neither a wiring lead pattern 61*p* nor a wiring lead pattern 62*p* is formed is shown, the wiring patterns can be formed by appropriately using the insulating substrate 10.

Figure 15:
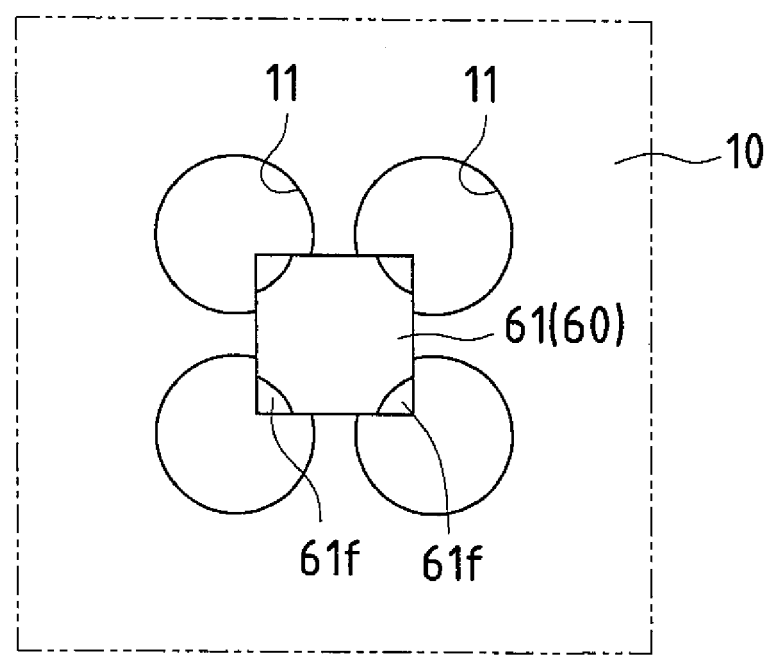
FIG. 15 is a plan view showing Example 8 of the double-sided wiring board according to Embodiment 2 of the present invention.

FIG. 15 is a plan view showing Example 8 of the double-sided wiring board according to Embodiment 2 of the present invention.

In a double-sided wiring board 1 (a connecting device 1*cd*) according to Example 8, four circular substrate holes 11 are formed so that the four substrate holes 11 are arranged corresponding to the vertices of a square (a quadrilateral), and a single square connecting land portion 60 (a first-side connecting land portion 61 and a second-side connecting land portion 62; however, the second-side connecting land portion 62 is not shown) is provided on an insulating substrate 10.

Accordingly, the square of the connecting land portion 60 is disposed so that the vertices of the square respectively overlap the circular shape of the substrate holes 11, and corners corresponding to the vertices of the square form peripheral end portions 61*f* in which the first-side connecting land portion 61 and the second-side connecting land portion 62 are connected to each other. That is to say, the same effects as in Example 1 are obtained.

It should be noted that the end-face shape of this double-sided wiring board 1 is similar to that of the above-described double-sided wiring boards 1 (see FIGS. 8A to 11B) according to Embodiment 2, and thus is omitted from FIG. 15. Moreover, although a case where neither a wiring lead pattern 61*p* nor a wiring lead pattern 62*p* is formed is shown, the wiring patterns can be formed by appropriately using the insulating substrate 10.

Figure 16:
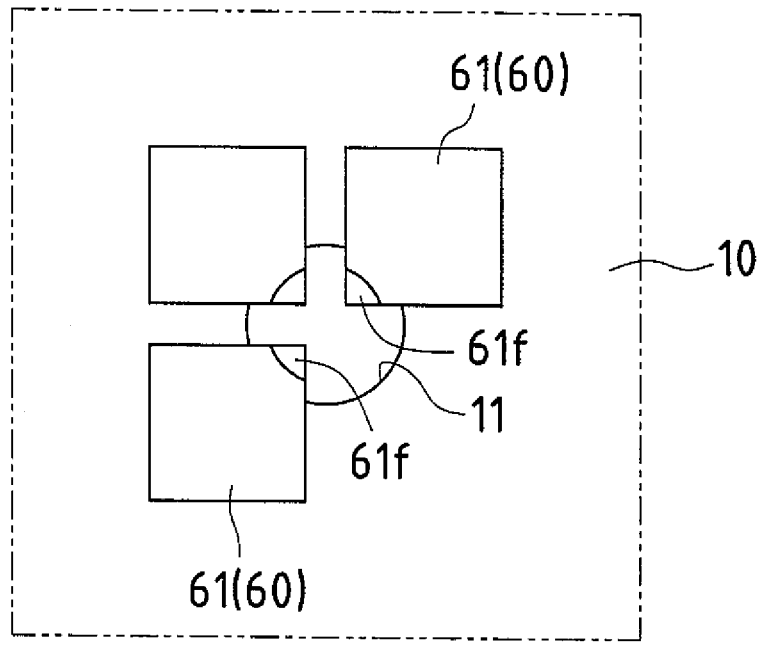
FIG. 16 is a plan view showing Example 9 of the double-sided wiring board according to Embodiment 2 of the present invention.

FIG. 16 is a plan view showing Example 9 of the double-sided wiring board according to Embodiment 2 of the present invention.

In a double-sided wiring board 1 (a connecting device 1*cd*) according to Example 9, a single circular substrate hole 11 is formed and three squares (quadrilaterals) are arranged so that a vertex of each of the three squares is disposed corresponding to the single circular substrate hole 11, and three square connecting land portions 60 (first-side connecting land portions 61 and second-side connecting land portions 62; however, the second-side connecting land portions 62 are not shown) are provided on an insulating substrate 10.

Accordingly, the squares of the connecting land portions 60 are disposed so that one vertex of each of the squares overlaps the circular shape of the substrate hole 11, and corners corresponding to those vertices of the squares form peripheral end portions 61*f* in which the first-side connecting land portion 61 and the second-side connecting land portion 62 are connected to each other. That is to say, the same effects as in Example 1 are obtained.

It should be noted that the end-face shape of this double-sided wiring board 1 is similar to that of the above-described double-sided wiring boards 1 (see FIGS. 8A to 11B) according to Embodiment 2, and thus is omitted from FIG. 16. Moreover, although a case where neither a wiring lead pattern 61*p* nor a wiring lead pattern 62*p* is formed is shown, the wiring patterns can be formed by appropriately using the insulating substrate 10.

In Example 9, a plurality of connecting devices 1*cd* are formed for a single substrate hole 11. Therefore, the shared use of the substrate hole 11 by the plurality of connecting devices 1*cd* is possible. Thus, the area of substrate holes 11 can be reduced by reducing the number of substrate holes 11, so that sufficient strength of the insulating substrate 10 can be secured. As a result, the peel strength of the connecting devices 1*cd* can be further improved, and thus the reliability can be improved.

Figure 17:
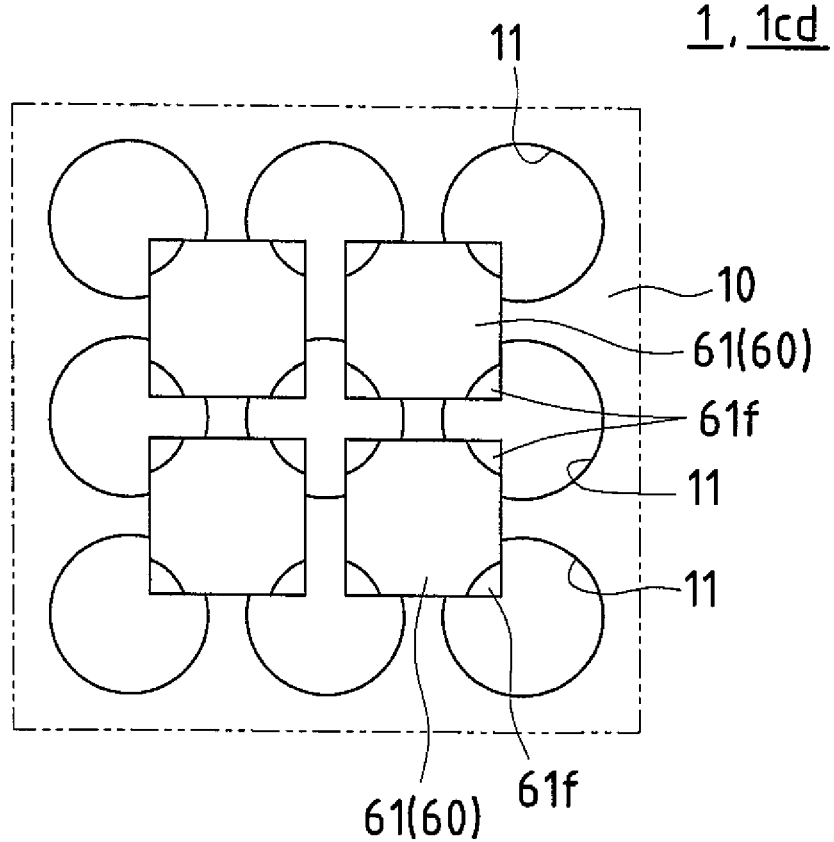
FIG. 17 is a plan view showing Example 10 of the double-sided wiring board according to Embodiment 2 of the present invention.

FIG. 17 is a plan view showing Example 10 of the double-sided wiring board according to Embodiment 2 of the present invention.

In a double-sided wiring board 1 (a connecting device 1cd) according to Example 10, nine circular substrate holes 11 are arranged in a matrix of three rows and three columns, and at four positions within the thus formed mesh, four square (quadrilateral) connecting land portions 60 (first-side connecting land portions 61 and second-side connecting land portions 62; however, the second-side connecting land portions 62 are not shown) are respectively provided corresponding to two rows and two columns of the matrix.

Accordingly, the square of each of the four connecting land portions 60 is disposed so that the four vertices of the square respectively overlap the circular shape of the substrate holes 11, and corners corresponding to those vertices of the square form peripheral end portions 61f in which the first-side connecting land portion 61 and the second-side connecting land portion 62 are connected to each other. That is to say, the same effects as in Examples 1 and 9 are obtained.

It should be noted that the end-face shape of this double-sided wiring board 1 is similar to that of the above-described double-sided wiring boards 1 (see FIGS. 8A to 11B) according to Embodiment 2, and thus is omitted from FIG. 17. Moreover, although a case where neither a wiring lead pattern 61p nor a wiring lead pattern 62p is formed is shown, the wiring patterns can be formed by appropriately using the insulating substrate 10.

It should be noted that the circular shape and the polygonal shapes (square, quadrilateral, pentagon) shown in the above-described Examples 1 to 10 are not intended to be limiting, and various changes can be made to the shape and the arrangement of the substrate hole(s) 11 and the connecting land portion(s) 60. Thus, the connecting device 1cd can be formed as required in the double-sided wiring board 1.

Moreover, by optimizing the orientation and the wiring direction of the connecting land portion(s) 60, the wiring lead pattern(s) 61p, and the wiring lead pattern(s) 62p, the area of a connecting device 1cd group can be reduced, and thus a double-sided wiring board 1 that is capable of high-density wiring and high-density mounting can be provided.

It should be noted that, for example, the land diameter and the land side length of a connecting land portion 60 can be, for example, about several tens of µm to several hundreds of µm, and the spacing between connecting devices 1cd can be, for example, several tens of µm to several hundreds of µm.

Embodiment 3

Next, a mounting double-sided wiring board according to the present invention will be described with reference to FIGS. 18A to 19C.

Figure 18A:
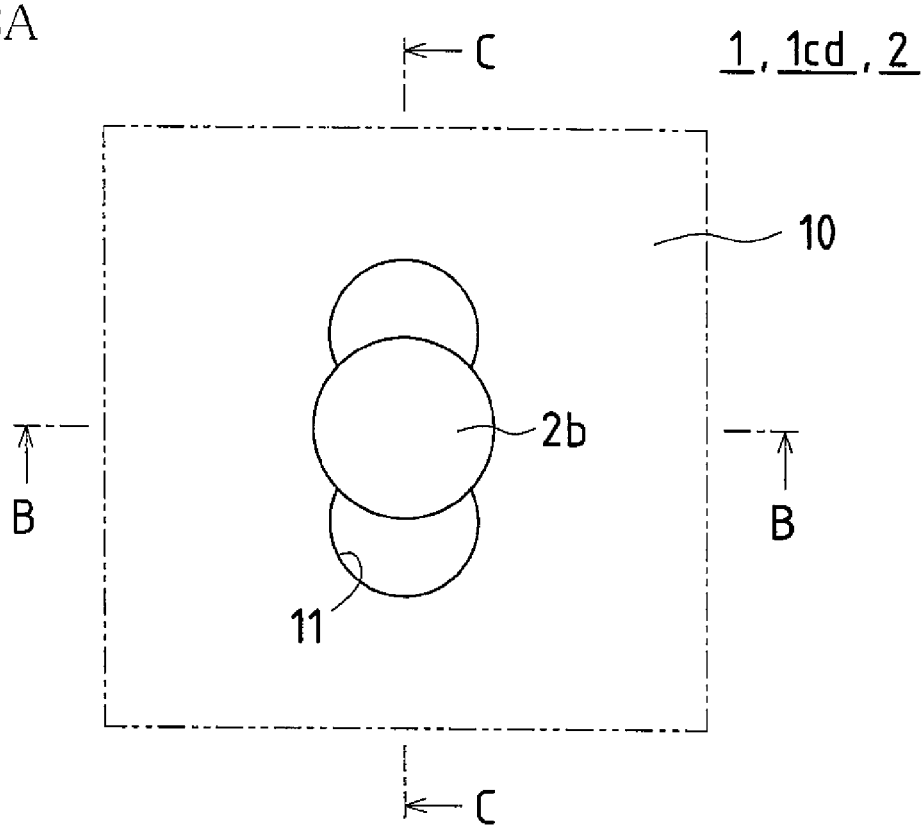
FIG. 18A is a plan view schematically showing the configuration of a mounting double-sided wiring board according to Embodiment 3 of the present invention.
Figure 18B:
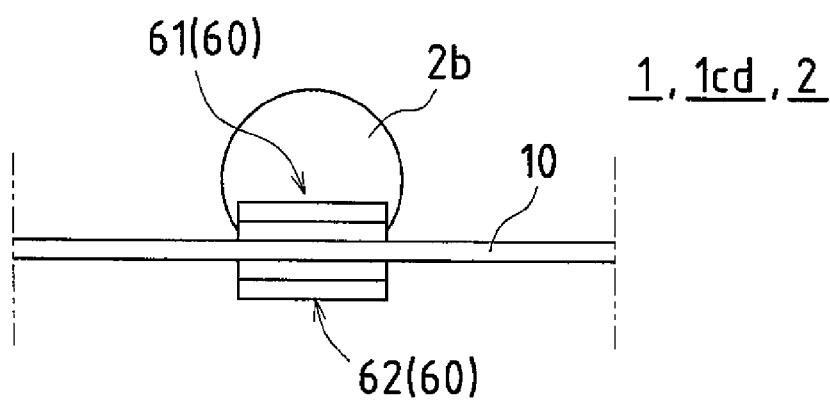
FIG. 18B is an end face view as viewed from arrows B-B in FIG. 18A.
Figure 18C:
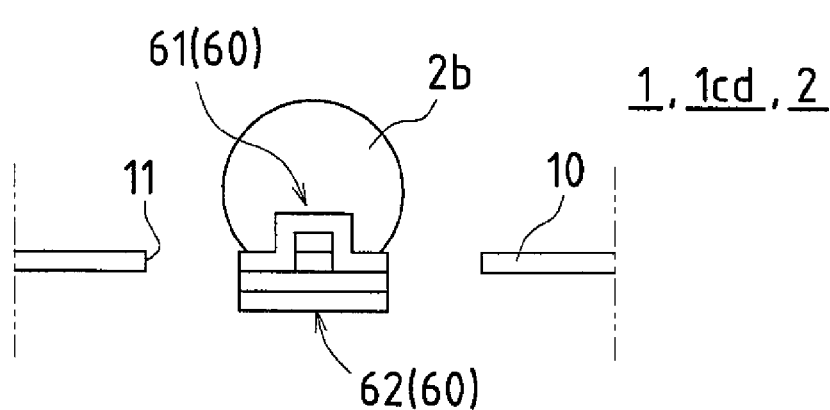
FIG. 18C is an end face view as viewed from arrows C-C in FIG. 18A.

FIG. 18A is a plan view schematically showing the configuration of a mounting double-sided wiring board according to Embodiment 3 of the present invention, FIG. 18B is an end face view as viewed from arrows B-B in FIG. 18A, and FIG. 18C is an end face view as viewed from arrows C-C in FIG. 18A.

In a mounting double-sided wiring board 2 according to Embodiment 3, a solder ball 2b connected to the outside (an external electronic component, which is not shown) is provided on the first-side connecting land portion 61 of the double-sided wiring board 1 (see FIG. 7A) formed in Embodiment 1.

In Embodiment 3, the central region of the first-side connecting land portion 61 protrudes with respect to a connecting position between the first-side connecting land portion 61 and the second-side connecting land portion 62 in the substrate holes 11 (see FIG. 7C). Therefore, even when the solder ball 2b is formed, there is no risk of an air bubble being contained between the solder ball 2b and the first-side connecting land portion 61, so that a very strong and highly reliable connection (soldering) can be achieved. Moreover, as described in Embodiment 1, the steps at the side faces of the first-side connecting land portion 61 can also contribute to an improvement of the connection strength.

Moreover, in the mounting double-sided wiring board 2, thermal stress such as linear expansion due to heating during solder joining can be suppressed by the substrate holes 11, so that a fine-pitch, high-density, and high-terminal-count semiconductor device, for example, a CSP (Chip Size Package) semiconductor device can be precisely and reliably connected thereto. That is to say, a mounting double-sided wiring board 2 that effectively serves as a carrier substrate of a CSP or the like can be provided.

It should be noted that the double-sided wiring board 1 is not limited to that of Embodiment 1, and the double-sided wiring boards 1 according to Embodiment 2 can also be used.

Figure 19A:
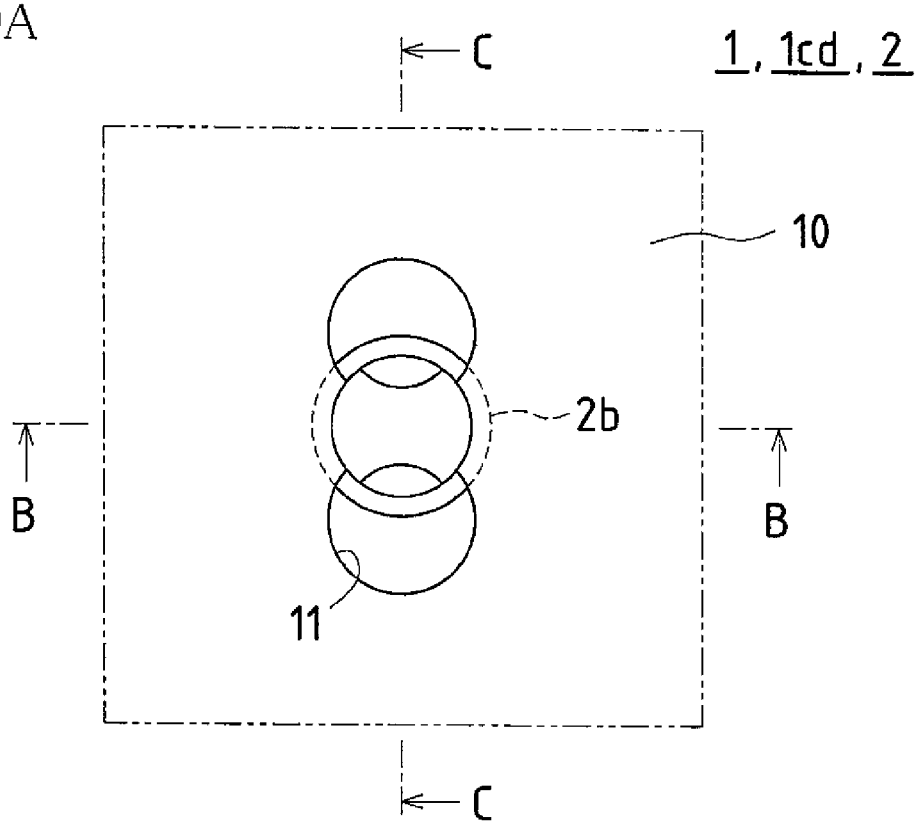
FIG. 19A is a plan view schematically showing the configuration of a mounting double-sided wiring board according to Embodiment 3 of the present invention.
Figure 19B:
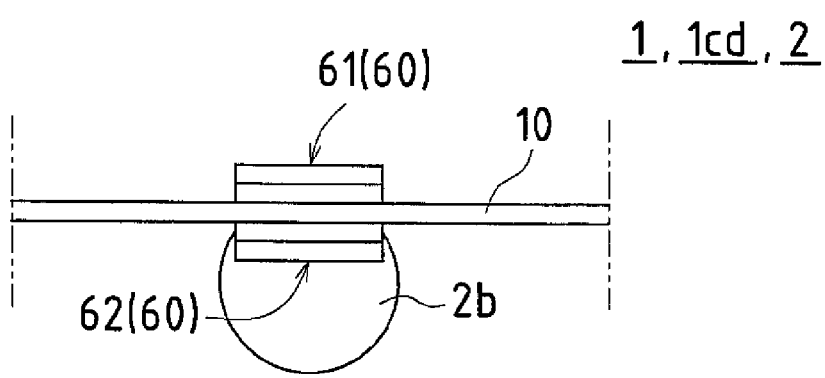
FIG. 19B is an end face view as viewed from arrows B-B in FIG. 19A.
Figure 19C:
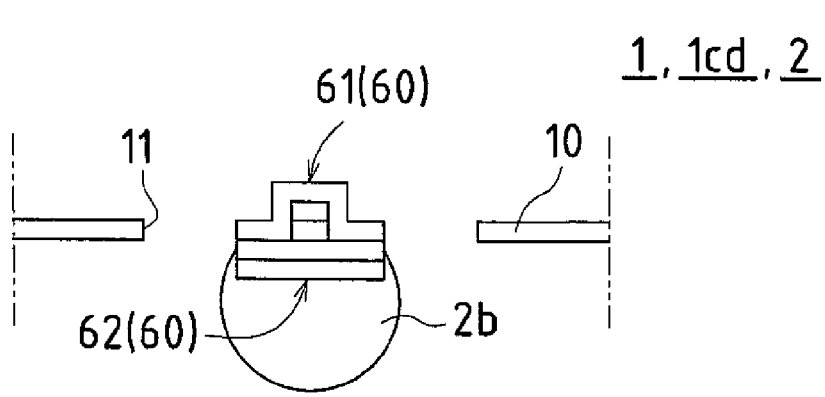
FIG. 19C is an end face view as viewed from arrows C-C in FIG. 19A FIGS. 20A and 20B schematically show the structure of a double-sided wiring board according to Conventional Example 1, where
Figure 20A:
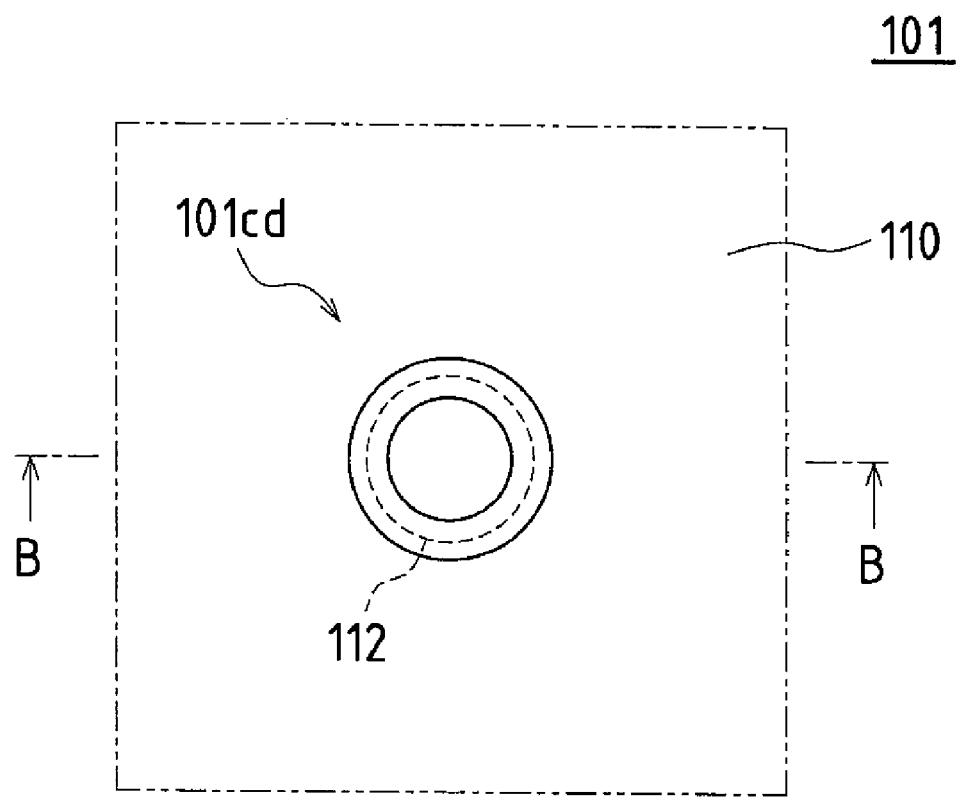
FIG. 20A is a plan view and FIG. 20B is an end face view as viewed from arrows B-B in FIG. 20A.
Figure 20B:
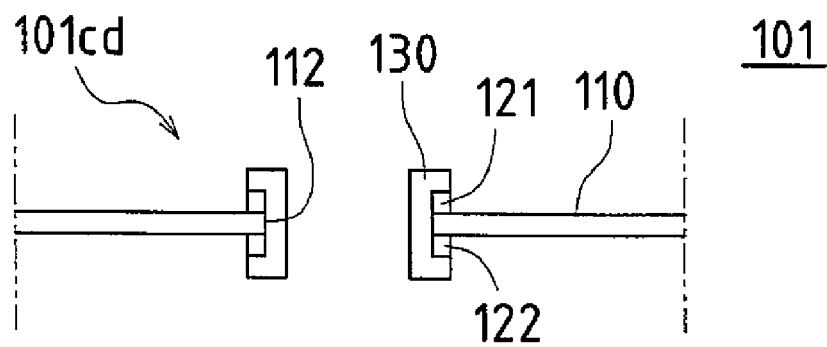
Figure 21A:
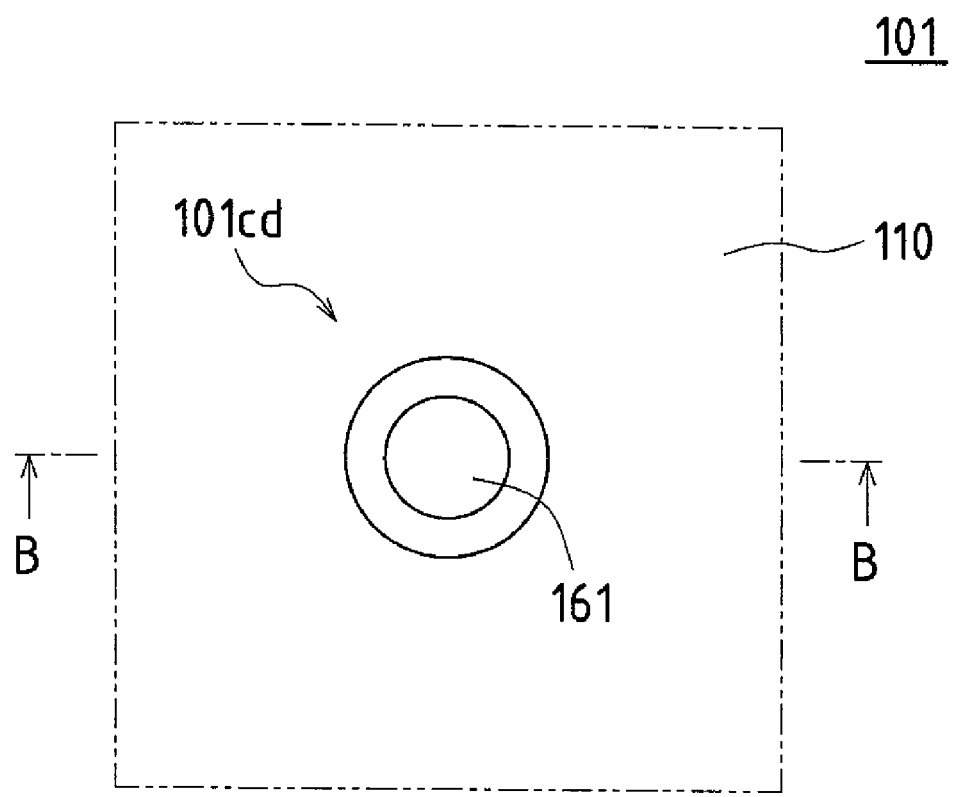
FIGS. 21A and 21B schematically show the structure of a double-sided wiring board according to Conventional Example 2, where
Figure 21B:
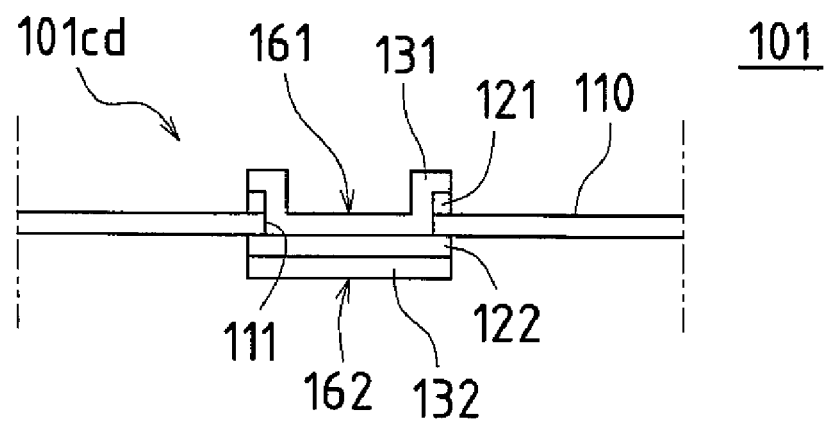
Figure 22A:
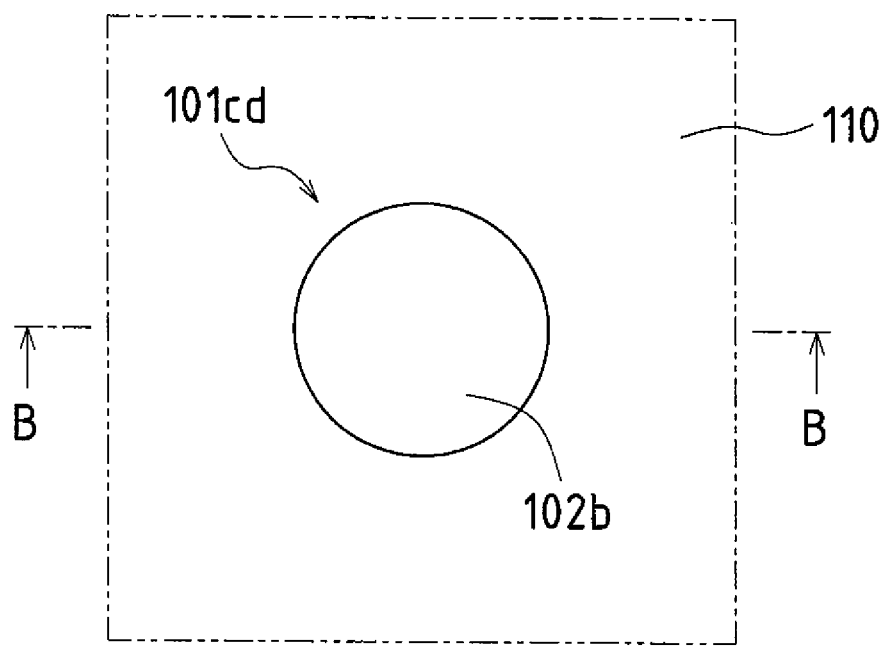
FIGS. 22A and 22B schematically show the structure of a mounting double-sided wiring board according to Conventional Example 3, where
Figure 22B:
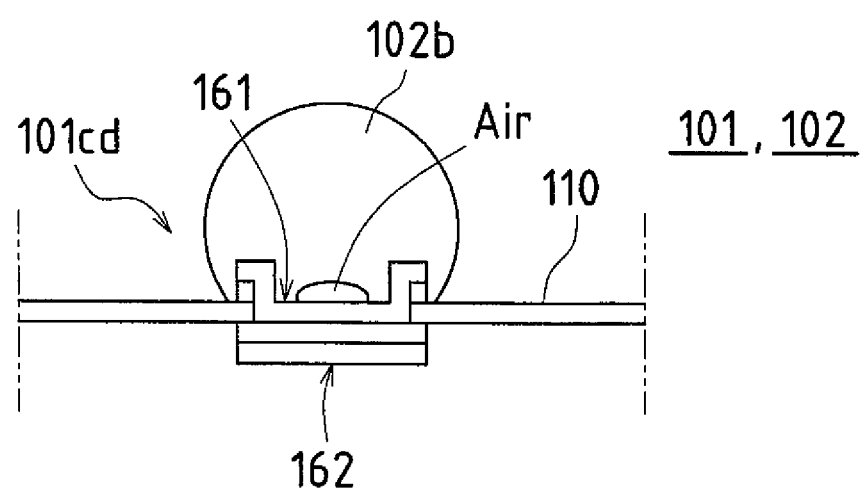

FIG. 19A is a plan view schematically showing the configuration of a mounting double-sided wiring board according to Embodiment 3 of the present invention, FIG. 19B is an end face view as viewed from arrows B-B in FIG. 19A, and FIG. 19C is an end face view as viewed from arrows C-C in FIG. 19A.

In a mounting double-sided wiring board 2 according to Embodiment 3, a solder ball 2b connected to the outside (an external electronic component, which is not shown) is provided on the second-side connecting land portion 62 of the double-sided wiring board 1 (see FIG. 7A) formed in Embodiment 1. That is to say, this mounting double-sided wiring board 2 is a modified example of FIGS. 18A to 18C.

Also in this example, the second-side connecting land portion 62 has no recess in which an air bubble can be trapped, so that the same effects as in the case of FIGS. 18A to 18C can be obtained.

As described above, the mounting double-sided wiring board 2 according to Embodiment 3 includes a double-sided wiring board 1 that has a connecting device 1cd serving as a connecting region to be connected to the outside and a solder ball 2b that is joined to the connecting device 1cd and connected to the outside, and the double-sided wiring board 1 can be a double-sided wiring board 1 according to any one of Embodiments 1 and 2. Therefore, the connection strength between the double-sided wiring board 2 and an external portion (an external electronic component, which is not shown) mounted thereon can be improved, and thus a highly reliable mounting double-sided wiring board 2 can be provided.

The present invention may be embodied in various other forms without departing from the spirit or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

What is claimed is:

1. A double-sided wiring board provided with a connecting device serving as a connecting region to be connected to the outside, the double-sided wiring board comprising:
   an insulating substrate,
   a plurality of substrate holes being formed in the insulating substrate for a single said connecting device, a first-side conductive layer formed on a first side of the insulating substrate, a second-side conductive layer formed on a second side opposite the first side, and a first-side connecting conductive layer that is laminated on the first-side conductive layer and that connects the first-side conductive layer and the second-side conductive layer to each other within each of the substrate holes, the second-side conductive layer protruding into each of the substrate holes, wherein the connecting device comprises a first-side connecting land portion configured by the first-side conductive layer and the first-side connecting conductive layer and a second-side connecting land portion configured by the second-side conductive layer, the first-side connecting land portion and the second-side connecting land portion face each other with the insulating substrate sandwiched therebetween, each of the substrate holes is formed to include a peripheral end portion of the first-side connecting land portion and a peripheral end portion of the second-side connecting land portion, and the peripheral end portion of the first-side connecting land portion and the peripheral end portion of the second-side connecting land portion protrude into each of the substrate holes and are connected to each other within the substrate hole.

2. The double-sided wiring board according to claim 1, wherein a plurality of connecting devices are foamed for a single substrate hole.

3. The double-sided wiring board according to claim 1, wherein the first-side connecting land portion and the second-side connecting land portion are formed into polygonal shapes facing each other, and facing corners are connected to each other via the substrate hole.

4. The double-sided wiring board according to claim 1, wherein a central region of the first-side connecting land portion protrudes with respect to a connecting position between the first-side connecting land portion and the second-side connecting land portion connected to each other via the substrate hole.

5. A mounting double-sided wiring board comprising a double-sided wiring board that has a connecting device serving as a connecting region to be connected to the outside and a solder ball that is joined to the connecting device and connected to the outside, wherein the double-sided wiring board is a double-sided wiring board according to any one of claims 1 and 2-4.

* * * * *